US010916675B2

(12) United States Patent
Suarez et al.

(10) Patent No.: US 10,916,675 B2
(45) Date of Patent: Feb. 9, 2021

(54) HIGH EFFICIENCY MULTIJUNCTION PHOTOVOLTAIC CELLS

(71) Applicant: ARRAY PHOTONICS, INC., Tempe, AZ (US)

(72) Inventors: Ferran Suarez, Chandler, AZ (US); Ting Liu, San Jose, CA (US); Homan B. Yuen, Santa Clara, CA (US); David Taner Bilir, Redwood City, CA (US); Arsen Sukiasyan, Plainsboro, NJ (US); Jordan Lang, Sunnyvale, CA (US)

(73) Assignee: ARRAY PHOTONICS, INC., Tempe, AZ (US)

( * ) Notice: Subject to any disclaimer, the term of this patent is extended or adjusted under 35 U.S.C. 154(b) by 166 days.

(21) Appl. No.: 16/282,762

(22) Filed: Feb. 22, 2019

(65) Prior Publication Data
US 2019/0189826 A1    Jun. 20, 2019

Related U.S. Application Data

(62) Division of application No. 14/887,021, filed on Oct. 19, 2015, now abandoned.

(51) Int. Cl.
*H01L 21/00*    (2006.01)
*H01L 31/0725*  (2012.01)
*H01L 31/0735*  (2012.01)
*H01L 31/0304*  (2006.01)
*H01L 31/0687*  (2012.01)

(52) U.S. Cl.
CPC .... *H01L 31/0725* (2013.01); *H01L 31/03048* (2013.01); *H01L 31/0687* (2013.01); *H01L 31/0735* (2013.01); *Y02E 10/544* (2013.01)

(58) Field of Classification Search
CPC .......... H01L 31/0725; H01L 31/03048; H01L 31/0687; H01L 31/0735; Y02E 10/544
See application file for complete search history.

(56) References Cited

U.S. PATENT DOCUMENTS

| 4,179,702 A | 12/1979 | Lamorte |
| 4,404,421 A | 9/1983 | Fraas |
| 4,881,979 A | 11/1989 | Lewis |
| 4,935,384 A | 6/1990 | Wanlass |
| 5,009,719 A | 4/1991 | Yoshida |

(Continued)

FOREIGN PATENT DOCUMENTS

| CN | 1917241 A | 2/2007 |
| EP | 595634 | 5/1994 |

(Continued)

OTHER PUBLICATIONS

Aho et al., "Temperature Coefficients for GaInP/GaAs/GaInNAsSb Solar Cells," 11th International Conference on Concentrator Photovoltaic Systems, AIP Conference Proceedings, Sep. 2015, vol. 1679, p. 050001-1-5.

(Continued)

*Primary Examiner* — Caleb E Henry
(74) *Attorney, Agent, or Firm* — Morrison & Foerster LLP

(57) ABSTRACT

Multijunction photovoltaic cells having at least three subcells are disclosed, in which at least one of the subcells comprises a base layer formed of GaInNAsSb. The GaInNAsSb subcells exhibit high internal quantum efficiencies over a broad range of irradiance energies.

11 Claims, 11 Drawing Sheets

(56) References Cited

U.S. PATENT DOCUMENTS

| | | |
|---|---|---|
| 5,016,562 A | 5/1991 | Madan et al. |
| 5,166,761 A | 11/1992 | Olson et al. |
| 5,223,043 A | 6/1993 | Olson et al. |
| 5,316,593 A | 5/1994 | Olson et al. |
| 5,342,453 A | 8/1994 | Olson et al. |
| 5,376,185 A | 12/1994 | Wanlass |
| 5,405,453 A | 4/1995 | Ho et al. |
| 5,689,123 A | 11/1997 | Major et al. |
| 5,800,630 A | 9/1998 | Vilela et al. |
| 5,911,839 A | 6/1999 | Tsai et al. |
| 5,935,345 A | 8/1999 | Kuznicki |
| 5,944,913 A | 8/1999 | Hou et al. |
| 6,150,603 A | 11/2000 | Karam et al. |
| 6,252,287 B1 | 6/2001 | Kurtz et al. |
| 6,281,426 B1 | 8/2001 | Olson et al. |
| 6,340,788 B1 | 1/2002 | King et al. |
| 6,504,091 B2 | 1/2003 | Hisamatsu et al. |
| 6,617,618 B2 | 9/2003 | Sato |
| 6,660,928 B1 | 12/2003 | Patton et al. |
| 6,756,325 B2 | 6/2004 | Bour et al. |
| 6,764,926 B2 | 7/2004 | Takeuchi et al. |
| 6,765,238 B2 | 7/2004 | Chang et al. |
| 6,787,385 B2 | 9/2004 | Barber et al. |
| 6,815,736 B2 | 11/2004 | Mascarenhas |
| 6,951,819 B2 | 10/2005 | Iles et al. |
| 7,071,407 B2 | 7/2006 | Faterni et al. |
| 7,119,271 B2 | 10/2006 | King et al. |
| 7,122,733 B2 | 10/2006 | Narayanan et al. |
| 7,122,734 B2 | 10/2006 | Fetzer et al. |
| 7,123,638 B2 | 10/2006 | Leary et al. |
| 7,126,052 B2 | 10/2006 | Fetzer et al. |
| 7,255,746 B2 | 8/2007 | Johnson et al. |
| 7,279,732 B2 | 10/2007 | Meng et al. |
| 7,709,287 B2 | 5/2010 | Fatemi et al. |
| 7,727,795 B2 | 6/2010 | Stan et al. |
| 7,807,921 B2 | 10/2010 | Fetzer et al. |
| 7,842,881 B2 | 11/2010 | Cornfeld et al. |
| 8,029,905 B2 | 10/2011 | Kouvetakis et al. |
| 8,067,687 B2 | 11/2011 | Wanlass |
| 8,575,473 B2 | 11/2013 | Jones et al. |
| 8,636,844 B1 | 1/2014 | Dargis et al. |
| 8,895,838 B1 | 11/2014 | Weiser et al. |
| 8,912,433 B2 * | 12/2014 | Jones .................. C22C 28/00 |
| | | 136/262 |
| 9,018,522 B2 | 5/2015 | Jones-Albertus et al. |
| 9,153,724 B2 | 10/2015 | Jones-Albertus et al. |
| 9,768,339 B2 | 9/2017 | Yanka et al. |
| 2002/0000546 A1 | 1/2002 | Sato |
| 2002/0117675 A1 | 8/2002 | Mascarenhas |
| 2002/0195137 A1 | 12/2002 | King et al. |
| 2003/0070707 A1 | 4/2003 | King et al. |
| 2003/0145884 A1 | 8/2003 | King et al. |
| 2004/0045598 A1 | 3/2004 | Narayanan et al. |
| 2004/0079408 A1 | 4/2004 | Fetzer et al. |
| 2004/0130002 A1 | 7/2004 | Weeks et al. |
| 2004/0187912 A1 | 9/2004 | Takamoto et al. |
| 2004/0200523 A1 | 10/2004 | King et al. |
| 2005/0139863 A1 | 6/2005 | Weiser et al. |
| 2005/0155641 A1 | 7/2005 | Fafard |
| 2005/0274409 A1 | 12/2005 | Fetzer et al. |
| 2006/0144435 A1 | 7/2006 | Wanlass |
| 2006/0162768 A1 | 7/2006 | Wanlass et al. |
| 2007/0034853 A1 | 2/2007 | Robbins et al. |
| 2007/0131275 A1 | 6/2007 | Kinsey et al. |
| 2007/0227588 A1 | 10/2007 | Gossard et al. |
| 2008/0035939 A1 | 2/2008 | Puetz et al. |
| 2008/0149173 A1 | 6/2008 | Sharps |
| 2008/0245400 A1 | 10/2008 | Li |
| 2008/0257405 A1 | 10/2008 | Sharps |
| 2009/0001412 A1 | 1/2009 | Nagai et al. |
| 2009/0014061 A1 | 1/2009 | Harris |
| 2009/0057721 A1 | 3/2009 | Miura et al. |
| 2009/0078310 A1 | 3/2009 | Stan et al. |
| 2009/0145476 A1 | 6/2009 | Fetzer et al. |
| 2009/0155952 A1 | 6/2009 | Stan et al. |
| 2009/0229659 A1 | 9/2009 | Wanlass et al. |
| 2009/0255575 A1 | 10/2009 | Tischler |
| 2009/0255576 A1 | 10/2009 | Tischler |
| 2009/0272438 A1 | 11/2009 | Cornfeld |
| 2009/0288703 A1 | 11/2009 | Stan et al. |
| 2010/0087028 A1 | 4/2010 | Porthouse et al. |
| 2010/0096001 A1 | 4/2010 | Sivananthan et al. |
| 2010/0180936 A1 | 7/2010 | Kim |
| 2010/0218819 A1 | 9/2010 | Farmer et al. |
| 2010/0282305 A1 | 11/2010 | Sharps et al. |
| 2010/0282306 A1 | 11/2010 | Sharps et al. |
| 2010/0319764 A1 | 12/2010 | Wiemer et al. |
| 2011/0023958 A1 | 2/2011 | Masson et al. |
| 2011/0114163 A1 | 5/2011 | Wiemer et al. |
| 2011/0210313 A1 | 9/2011 | Fuji et al. |
| 2011/0232730 A1 | 9/2011 | Jones et al. |
| 2011/0254052 A1 | 10/2011 | Kouvetakis et al. |
| 2011/0303268 A1 | 12/2011 | Tan et al. |
| 2012/0031478 A1 | 2/2012 | Boisvert et al. |
| 2012/0103403 A1 | 5/2012 | Misra et al. |
| 2012/0211071 A1 | 8/2012 | Newman et al. |
| 2012/0216858 A1 | 8/2012 | Jones-Albertus et al. |
| 2012/0216862 A1 | 8/2012 | Abou-Kandil et al. |
| 2012/0227797 A1 | 9/2012 | Stan et al. |
| 2012/0285526 A1 | 11/2012 | Jones-Albertus et al. |
| 2013/0014815 A1 | 1/2013 | Jones-Albertus et al. |
| 2013/0118546 A1 * | 5/2013 | Jones-Albertus ................. |
| | | H01L 31/1852 |
| | | 136/244 |
| 2013/0118566 A1 | 5/2013 | Jones-Albertus et al. |
| 2013/0122638 A1 | 5/2013 | Jones-Albertus et al. |
| 2013/0220409 A1 | 5/2013 | Jones-Albertus et al. |
| 2013/0344645 A1 | 12/2013 | Ahmari et al. |
| 2014/0137930 A1 * | 5/2014 | Derkacs ............ H01L 31/043 |
| | | 136/255 |
| 2015/0083204 A1 * | 3/2015 | Yoon ................ H01L 31/1848 |
| | | 136/255 |
| 2015/0214412 A1 | 7/2015 | Jones-Albertus et al. |
| 2015/0221803 A1 * | 8/2015 | Suarez Arias ...... H01L 31/0547 |
| | | 136/249 |
| 2016/0118526 A1 | 4/2016 | Misra et al. |
| 2017/0110613 A1 | 4/2017 | Suarez |
| 2017/0338357 A1 * | 11/2017 | Liu ................. H01L 31/03042 |
| 2019/0013430 A1 * | 1/2019 | Jones-Albertus ..... H01L 31/109 |
| 2019/0288147 A1 * | 9/2019 | Misra ................. H01L 31/0725 |

FOREIGN PATENT DOCUMENTS

| | | |
|---|---|---|
| EP | 3159935 | 4/2017 |
| JP | 63100781 A | 5/1988 |
| JP | 6061513 A | 3/1994 |
| JP | 6061516 A | 3/1994 |
| JP | 10012905 A | 1/1998 |
| JP | 2006-270060 A | 10/2006 |
| JP | 2008-270760 A | 11/2008 |
| TW | 200924214 A | 6/2009 |
| TW | 200933913 A | 8/2009 |
| TW | 201131788 A | 9/2011 |
| WO | 2010/151553 A1 | 12/2010 |
| WO | 2011/062886 A1 | 5/2011 |
| WO | 2011/123164 A1 | 10/2011 |
| WO | 2012/057874 A1 | 5/2012 |
| WO | 2012/115838 A1 | 8/2012 |
| WO | 2012/154455 A1 | 11/2012 |

OTHER PUBLICATIONS

Asbeck et al., "Heterojunction bipolar transistors implemented with GaInNAs materials," Semiconductor Science and Technology, vol. 17, No. 8, pp. 898-906, Jul. 2002.

Bank, et al., "Molecular-beam epitaxy growth of low-threshold cw GaInNAsSb lasers at 1.5 μm," pp. 1337-1340, J. Vac. Sci. Technol. B 23(3), May/Jun 2005.

Baranowski et al., "Time-resolved photoluminescence studies of annealed 1.3-um GaInNAsSb quantum wells," Nanoscale Research Letters, 2014, vol. 9, No. 81, 5 pages.

(56) References Cited

OTHER PUBLICATIONS

Baribeau et al., "Heteroepitaxy of Ge on (100) Si substrates," Journal of Vacuum Science & Technology, Jul./Aug. 1987, A 5 (4), 6 pages.

Bertness et al., "29.5%-Efficient GaInP/GaAs Tandem Solar Cells," Applied Physics Letters, vol. 65, Aug. 22, 1994, pp. 989-991.

Bhuiyan et al., "InGaN Solar Cells: Present State of the Art and Important Challenges", IEEE Journal of Photovoltaics, vol. 2, No. 3, Jul. 2012, p. 246-293.

Cheah et al., "GaAs-Based Heterojunction p-i-n Photodetectors Using Pentanary InGaAsNSb as the Intrinsic Layer," IEEE Photonics Technology Letters, Sep. 2005, vol. 17, No. 9, p. 1932-1934.

Cornfeld et al., "Evolution of a 2.05 eV AlGaInP Top Sub-cell for 5 and 6J-IMM Applications", Photovoltaic Specialists Conference (PVSC), 38th IEEE, Jun. 3, 2012, p. 2788-2791.

Cotal et al., "III-V multijunction solar cells for concentrating photovoltaics" pp. 174-192, www.rsc.org/ees, Energy and Environmental Science 2, (2009).

Dargis et al., "Growth and application of epitaxial heterostructures with polymorphous rare-earth oxides," Journal of Crystal Growth, 2013, vol. 378, p. 177-179.

Dargis et al., "Monolithic integration of rare-earth oxides and semiconductors for on-silicon technology," J. Vac. Sci. Tech., Aug. 2014, vol. 32, No. 4, p. 041506.

Denton et al., Vegard's Law, Physical Review, A, The American Physical Society, vol. 43 No. 6, pp. 3161-3164 (1991).

E. Wesoff, "CPV Roundup: SolFocus funding, 5MW order for Solar Junction, GreenVolts, Amonix", Greentech Media, May 22, 2012, 3 pages.

E. Wesoff, "Record 44 percent CPV efficiency from startup Solar Junction", Greentech Media, Oct. 15, 2012, 3 pages.

E. Wesoff, "Update: Solar Junction breaking CPV efficiency records, raising $30M", Greentech Media, Apr. 15, 2011, 4 pages.

Ferguson et al., Nonradiative Recombination in 1.56 μm GaInNAsSb/GaNAs Quantum-Well Lasers, pp. 1-3, published online Dec. 8, 2009, Applied Physics Letters 95, 231104 (2009).

Fewster P.F., "X-Ray Scattering From Semiconductors" Second Edition, Imperial College Press, London, 2003, Ch. 1, pp. 1-22.

Fitzgerald et al., "Dislocations in Relaxed SiGe/Si Heterostructures," Phys. Stat. Sol., 1999, vol. 171, p. 227-238.

Friedman et al., "Analysis of Depletion-Region Collection in GaInNAs Solar Cells," pp. 691-694, Conference Record of the Thirty-first IEEE Photovoltaic Specialists Conference, Lake Buena Vista, Florida, Jan. 3-7, 2005.

Friedman et al., "Analysis of the GaInP/GaAs/1-eV/Ge Cell and Related Structures for Terrestrial Concentration Application," pp. 856-859, Conference Record of the Twenty-ninth IEEE Photovoltaic Specialists Conference, New Orleans, LA., May 19-24, 2002.

Friedman et al., "1-eV Solar cells with GaInNAs active layer", Journal of Crystal Growth, vol. 195, 1998, p. 409-415.

Friedman et al., Breakeven Criteria for the GaInNAs Junction in GaInP/GaAs/GaInNAs/Ge Four-junction Solar Cells, pp. 331-344, Progress in Photovoltaics: Research and Applications. (2002).

Garcia et al., Analysis of Tellurium as N-Type Dopant in GaInP: Doping, Diffusion, Memory Effect and Surfactant Properties, pp. 794-799, Journal of Crystal Growth 298 (2007).

Geelen et al., Epitaxial Lift-Off GaAs Solar Cell From a Reusable GaAs Substrate, pp. 162-171, Materials Science and Engineering B45 (1997).

Geisz et al., "Inverted GaInP / (In)GaAs / InGaAs triple-junction solar cells with low-stress metamorphic bottom junctions," Proceedings of the 33rd IEEE PVSC Photovoltaics Specialists Conference, (2008).

Green et al., Progress in Photovoltaics: Research and Applications 19 (2011) pp. 565-572.

Green et al., Progress in Photovoltaics: Research and Applications 20 (2012) pp. 12-20.

Green, "Third Generation Photovoltaics: Advanced Solar Energy Conversion," pp. 95-109, Springer Publishing, Berlin, Germany (2003).

Green, Do Built-in Fields Improve Solar Cell Performance? pp. 57-66, Progress in Photovoltaics: Research and Applications (2009), Published online in Wiley InterScience (www.interscience.wiley.com) on Oct. 1, 2008.

Gu et al., "Gas Source Growth and Doping Characteristics of AlInP on GaAs" Materials Science and Engineering B 131 (2006), pp. 49-53.

Guter et al., "Current-matched triple-junction solar cell reaching 41.1% conversion efficiency under concentrated sunlight," Applied Physics Letters, Jun. 2009, vol. 94, No. 22, p. 223504.

Han et al., "1.55 um GaInNAs resonant-cavity-enhanced photodetector grown on GaAs," Applied Physics Letters, 2005, vol. 87, 111105.

Harris Jr. et al., "Development of GainNAsSb Alloys: Growth, band structure, optical properties and applications," Jul. 2007, Physics Status Solidi(b), vol. 244, Issue 8, pp. 2707-2729, Jul. 6, 2007.

Harris, James., "The opportunities, successes and challenges for GaInNAsSb," Journal of Crystal growth, 2005, vol. 278, p. 3-17.

Heroux et al., "GaInNAs resonant-cavity-enhanced photodetector operating at 1.3 um," Applied Physics Letters, Nov. 1999, vol. 75, No. 18, p. 2716-2718.

Hovel H.J., "Semiconductors and Semimetals", Academic Press, New York, 1975, Ch. 2, pp. 8-47.

Jackrel et al., "GaInNAsSb Solar Cells Grown by Molecular Beam Epitaxy," 2006. Photovoltaic Energy Conversion, Conference Record of the 2006 IEEE 4th World Conference, vol. 1, p. 783-786, May 2006.

Jackrel et al., "GaInNAsSb Solar Cells Grown by Molecular Beam Epitaxy," pp. 1-16, IEEE 4th World Conference on Photovoltaic Energy Conversion, Waikoloa, HI, 2006.

Jackrel et al., "Dilute nitride GainNAs and GainNAsSb solar cells by molecular beam epitaxy", Journal of Applied Physics 2007, 101, p. 114916.

Jackrel et al., "Thick lattice-matched GaInNAs films in photodetector applications," Proc. of SPIE, 2005, vol. 5728, p. 27-34.

Janotti et. al., Mutual Passivation of Electrically Active and Isovalent Impurities in Dilute Nitrides, Physical Review Letters 100, 045505 (2008).

Ketlhwaafetse, Richard, "Comparative Study of Dilute Nitride and Bismide Sub-Junctions for Tandem Solar Cells," A thesis for Ph.D. in applied physics, University of Essex, Jan. 2016, 175 pages.

Kim et al., "Characteristics of bulk InGaInNAs and InGaAsSbN materials grown by metal organic vapor phase epitaxy (MOVPE) for solar cell application," Proc. of SPIE, 2012, vol. 8256, 8 pages.

Kim et al., "Characteristics of bulk InGaAsSbN/GaAs grown by metalorganic vapor phase epitaxy (MOVPE)," Journal of Crystal Growth, 2013, p. 163-167.

King et al., "40% Efficient Metamorphic GaInP/GaInAs/Ge Multijunction Solar Cells," J. of Applied Physics Letters, May 4, 2007.

King et al., "High-Voltage, Low-Current GaInP/GaInP/GaAs/GaInNAs/Ge Solar Cells" Spectrolab Inc., 2002, pp. 852-855.

Kudrawiec et al., "Band Gap Discontinuity in Ga0.9In0.1N0.027As0.973-xSbx/GaAs Single Quantum Wells with 0<x<0.06 Studied by Contactless Electroreflectance Spectroscopy", Applied Physics Letters, 2006, vol. 88, p. 221113.

Kudrawiec, "Contactless electroreflectance of GaInNAsSb/GaAs single quantum wells with indium content of 8%-32%", Jan. 2007, Journal of Applied Physics, vol. 101, pp. 013504-1-013504-9.

Kurtz et al., "Understanding the potential and limitations of dilute nitride alloys for solar cells", Paper No. NREL/CP-520-38998, DOE Solar Energy Technologies Conference, Denver, CO, Nov. 7-10, 2005, 5 pages.

Kurtz et al., "Projected Performance of Three and Four-Junction Devices Using GaAs and GaInP," pp. 875-878, 26th IEEE Photovoltaics Specialists Conference, 1997.

Law et al., "Future technology pathways of terrestrial III-V multijunction solar cells for concentrator photovoltaic systems," Solar Energy Materials & Solar Cells 94 (2010) pp. 1314-1318.

Le Du et al., "Quantum-well saturable absorber at 1.55 um on GaAs substrate with a fast recombination rate," Applied Physics Letters, 2006, vol. 88, 201110.

(56) References Cited

OTHER PUBLICATIONS

Loke, W.K. et al., "Improvement of GaInNAs p-i-n photodetector responsivity by antimony incorporation," Journal of Applied Physics, 2007, vol. 101, p. 033122.

Merrill et al, Directions and Materials Challenges in High Performance Photovoltaics, Dec. 2007, JOM Energetic Thin Films, 59, 12, 26-30.

Miller et al., "GaAs-AlGaAs tunnel junctions for multigap cascade solar cells", Journal of Applied Physics, vol. 53, No. 1, Jan. 1982, p. 744-748.

Miyashita et al., "Improvement of GaInNAsSb films fabricated by atomic hydrogen-assisted molecular beam epitaxy", pp. 3249-3251, Journal of Crystal Growth 311, 2009.

Miyashita et al., Effect of Indium Composition on GaInNAsSb Solar Cells Grown by Atomic Hydrogen-Assisted Molecular Beam Epitaxy, pp. 000632-000635, 978-1-4244-2950@ 2009 IEEE.

Miyashita et al., "Generation and Collection of Photocarriers in Dilute Nitride GaInNAsSb Solar Cells," Progress in Photovoltaics: Research and Applications, 2016, vol. 24, p. 28-37.

Miyashita et al., "Characterization of 1.0 EV GaInNAsSb Solar Cells for Multijunction Applications and the Effect of Annealing," 31st European Photovoltaic Solar Energy Conference and Exhibition, Sep. 2015, p. 1461-1465.

Ng et al., 1EV GANXAS1-X-YSBY Material for Lattice-Matched III-V Solar Cell Implementation on GAAS and GE, pp. 76-80, (2009).

Ng et al., "Long wavelength bulk GaInNAs p-i-n photodiodes lattice matched to GaAs," Journal of Applied Physics, 2007, vol. 101, 064506, 6 pages.

Ni et al., "Optimization of GaInNAs(Sb)/GaAs quantum wells at 1.3-1.55 um grown by molecular beam epitaxy," Journal of Crystal Growth, 2007, vol. 301-302, p. 125-128.

Olson J.M. et al., "High-Efficiency III-V Multijunction Solar Cells" Handbook of Photovoltaic Science and Engineering, 1st ed.; Luque, A., Hegedus, S., Eds.; Wiley: New York, NY, USA, 2003; Chapter 9, pp. 359-411.

Patton et al., "Development of a High Efficiency Metamorphic Triple-junction 2.1 eV/1.6 eV/1.2 eV AlGaInP/InGaAsP/InGaAs Space Solar Cell", Conference Record of the IEEE Photovoltaic Specialists Conference, Institute of Electrical and Electronics Engineers Inc., May 19, 2002, vol. 29, p. 1027-1030.

Polojarvi et al., "Comparative study of defect levels in GaInNAs, NaNAsSb, and GaInNAsSb for High-Efficiency Solar Cells," Applied Physics Letters, 2016, vol. 108, No. 12, p. 122104.

Ptak et al., "Defects in GaInNAs: What We've Learned so Far" National Renewable Energy Laboratory NREL/CP-520-33555, May 2003, 7 pages.

Ptak et al., "Effects of Temperature, Nitrogen Ions and Antimony on Wide Depletion Width GaInNAs," pp. 955-959.J. Vac. Sci. Tech. B25(3), May/Jun. 2007 (published May 31, 2007).

Ptak et al., "Low-acceptor-Concentration GaInNAs grown by Molecular-beam Epitaxy for High-current p-i-n solar cell applications." J. of Applied Physics, 98.094501 (2005).

Ptak et al., "Effects of Bismuth on Wide-Depletion-Width GaInNAs Solar Cells," Journal of Vacuum Science and Technology, 2008, vol. 26, No. 3, p. 1053-1057.

Sabnis et al., "High-Efficiency Multijunction Solar Cells Employing Dilute Nitrides," 8th International Conference on Concentrating Photovoltaic Systems, AIP Conference Proceedings, Oct. 2012, vol. 1477, p. 14-19.

Sabnis et al., A new roadmap for space solar cells, Industry Photovoltaics, www.compoundsemiconductor.net/csc/features-details/19735471, Aug./Sep. 2012, 5 pages.

Solar Junction Inc., "Sharp Develops Solar Cell with Word's Highest Conversion Efficiency of 35.8%" Press Release, dated Oct. 22, 2009, 3 pages.

Takamoto et al., "InGaP/GaAs-based multijunction solar cells," Progress in Photovoltaics: Research and Applications, Sep. 2005, vol. 13, No. 6, p. 495-511.

Tan et al., "GaInNAsSb/GaAs Photodiodes for Long-Wavelength Applications," Electron-Device Letters, Jul. 2011, vol. 32, No. 7, p. 919-921.

Tan et al., "Improved Optoelectronic Properties of Rapid Thermally Annealed Dilute Nitride GaInNAs Photodetectors," Journal of Electronic Materials, 2012,vol. 41, No. 12, p. 3393-3401.

Tan et al., "Dilute nitride GaInNAs and GaInNAsSb for solar cell applications," Proc. of SPIE, 2012, vol. 8256, 10 pages.

Tan et al., "Reduction of dark current and unintentional background doping in InGaAsN photodetectors by ex situ annealing," Proc. of SPIE, 2010, vol. 7726, 8 pages.

Tan et al., "Experimental evaluation of impact ionization in dilute nitride GaInNAs diodes," Applied Physics Letters, 2013, vol. 103, p. 102101.

Tan et al., "High responsivity GaNAsSb p-i-n photodetectors at 1.3um growth by radio-frequency nitrogen plasma-assisted molecular beam epitaxy," Optics Express, May 2008, vol. 16, No. 11, p. 7720-7725.

Volz et al., MOVPE growth of dilute nitride III/V semiconductors using all liquid metalorganic precursors, Journal of Crystal Growth 311 (2009), pp. 2418-2526.

Volz et al., Optimization of Annealing Conditions of (GaIn)(NAs) for Solar Cell Applications, pp. 2222-2228, Journal of Crystal Growth 310 (2008).

Weyers et al., "Red shift of photoluminescence and absorption in dilute GaAsN alloy layers", Japan Journal of Applied Physics, vol. 31, Issue 7A, 1992, p. L853-L855.

Wicaksono et al., "Effect of growth temperature on defect states of GaAsSbN intrinsic layer in GaAs/GaAsSbN/GaAs photodiode for 1.3 um application," Journal of Applied Physics, 2007, vol. 102, p. 044505.

Wiemer et al., "43.5% Efficient Lattice Matched Solar Cells" Proc. SPIE 810804, High and Low Concentrator Systems for Solar Electric Applications VI (Sep. 19, 2011).

Wistey et al., Nitrogen Plasma Optimization for High-Quality Dilute Nitrides, pp. 229-233, Journal of Crystal Growth, available online on Feb. 1, 2005 at http://www.sciencedirect.com.

Wu et al., Band Anticrossing in Highly Mismatched III-V Semiconductor Alloys, pp. 860-869, Semiconductor Science and Technology 17 (2002).

Yamaguchi et al., "Multi-junction III-V solar cells: current status and future potential", in: Solar Energy, vol. 79, issue 1, Jul. 2005.

Yu et. al., Mutual Passivation of Group IV Donors and Nitrogen in Diluted GaNxAs1-x Alloys, pp. 2844-2846, Applied Physics Letters, vol. 83, No. 14 (Oct. 6, 2003).

Yuen, "The role of antimony on properties of widely varying GaInNAsSb compositions", Journal of Applied Physics, May 2006, vol. 99, p. 093504-1 to 093804-8.

Partial European Search Report for Application No. EP 16194680, dated Feb. 15, 2017, 3 pages.

European Search Report for Application No. 10849171.3, dated Jun. 1, 2017, 8 pages.

European Search Report for Application No. 16194680.1, dated May 29, 2017, 16 pages.

International Search Report and Written Opinion for Application No. PCT/US2017/032712, dated Aug. 2, 2017, 14 pages.

International Search Report and Written Opinion for PCT Application No. PCT/US2016/056437, dated Mar. 20, 2017, 19 pages.

Search Report for Singapore Application No. 102015033865, dated Feb. 16, 2017, 7 pages.

Search Report for European Application No. 18208211, dated Feb. 18, 2019, 7 pages.

Search Report for Taiwan Application No. 101116335, dated Dec. 5, 2016, 1 page.

Search Report for Taiwan Application No. 105133762, dated Jul. 12, 2017, 1 page.

International Preliminary Report on Patentability for PCT Application No. PCT/US2010/056800, dated May 31, 2012, 6 pages.

International Preliminary Report on Patentability for PCT Application No. PCT/US2011/036486, dated Apr. 30, 2013.

International Preliminary Report on Patentability PCT/US2008/008495 dated Jan. 12, 2010, 5 pages.

(56) References Cited

OTHER PUBLICATIONS

International Preliminary Report on Patentability PCT/US2017/032712 dated Dec. 6, 2018, 10 pages.
International Search Report and Written Opinion corresponding to the PCT application No. PCT/US10/39534, dated Sep. 8, 2010, 8 pages.
International Search Report and Written Opinion corresponding to the PCT application No. PCT/US10/56800, dated Jan. 26, 2011, 8 pages.
International Search Report and Written Opinion corresponding to the PCT application No. PCT/US11/36486, dated Aug. 25, 2011,12 pages.
International Search Report and Written Opinion corresponding to the PCT application No. PCT/US2010/061635 , dated Mar. 1, 2011 , 7 pages.
International Search Report and Written Opinion for PCT Application No. PCT/US2013/033567, dated Mar. 4, 2014, 12 pages.
International Search Report and Written Opinion of the International Searching Authority for PCT Application No. PCT/US 12/25307, dated Aug. 16, 2012, 13 pages.
International Search Report and Written Opinion of the International Searching Authority for PCT Application No. PCT/US 12/36020, dated Aug. 14, 2012, 11 pages.
International Search Report and Written Opinion PCT/US2008/008495 dated Apr. 6, 2009, 5 pages.
Extended European Search Report for EP Application No. 10849171.3, dated Aug. 9, 2016, 10 pages.
Amendment, Affidavits under 37 C.F.R. §132, and Information Disclosure Statement filed Nov. 2013 for U.S. Appl. No. 13/739,989, 51 pages.
Final Office Action for U.S. Appl. No. 12/217,818, dated Jan. 1, 2011, 15 pages.
Final Office Action for U.S. Appl. No. 12/819,534, dated Sep. 9, 2013, 13 pages.
Final Office Action for U.S. Appl. No. 12/914,710, dated Sep. 6, 2013, 17 pages.
Final Office Action for U.S. Appl. No. 12/944,439, dated May 29, 2013, 17 pages.
Final Office Action for U.S. Appl. No. 13/104,913, dated Oct. 2, 2013, 12 pages.
Final Office Action for U.S. Appl. No. 13/618,496, dated Feb. 6, 2013, 8 pages.
Final Office Action for U.S. Appl. No. 13/678,389, dated Oct. 10, 2014, 15 pages.
Final Office Action for U.S. Appl. No. 13/708,791, dated Oct. 1, 2013, 15 pages.
Final Office Action for U.S. Appl. No. 13/739,989, dated Feb. 26, 2014, 16 pages.
Non-Final Office Action for U.S. Appl. No. 12/944,439, dated Aug. 13, 2014, 11 pages.
Non-Final Office Action for U.S. Appl. No. 13/370,500, dated Dec. 31, 2013, 7 pages.
Non-Final Office Action for U.S. Appl. No. 12/217,818, dated Jun. 10, 2010, 15 pages.
Non-Final Office Action for U.S. Appl. No. 13/708,763, dated Apr. 15, 2013, 23 pages.
Non-Final Office Action for U.S. Appl. No. 12/749,076, dated Oct. 24, 2012, 17 pages.
Non-Final Office Action for U.S. Appl. No. 12/819,534, dated Feb. 13, 2013, 8 pages.
Non-Final Office Action for U.S. Appl. No. 12/819,534, dated Sep. 16, 2015, 10 pages.
Non-Final Office Action for U.S. Appl. No. 12/914,710, dated Feb. 15, 2013, 14 pages.
Non-Final Office Action for U.S. Appl. No. 12/944,439, dated Oct. 5, 2012, 15 pages.
Non-Final Office Action for U.S. Appl. No. 13/104,913, dated Nov. 8, 2012, 12 pages.
Non-Final Office Action for U.S. Appl. No. 13/442,146, dated Mar. 21, 2014, 6 pages.
Non-Final Office Action for U.S. Appl. No. 13/618,496, dated Dec. 14, 2012, 16 pages.
Non-Final Office Action for U.S. Appl. No. 13/678,389, dated Feb. 20, 2014, 13 pages.
Non-Final Office Action for U.S. Appl. No. 13/678,389, dated Jul. 6, 2015, 11 pages.
Non-Final Office Action for U.S. Appl. No. 13/708,791, dated Apr. 25, 2013, 16 pages.
Non-Final Office Action for U.S. Appl. No. 13/739,989, dated May 24, 2013, 7 pages.
Non-Final Office Action for U.S. Appl. No. 13/894,245, dated Jun. 24, 2015, 19 pages.
Non-Final Office Action for U.S. Appl. No. 14/678,737, dated Jul. 6, 2015, 13 pages.
Notice of Allowance for U.S. Appl. No. 12/914,710, dated Sep. 25, 2015, 13 pages.
Notice of Allowance for U.S. Appl. No. 13/104,913, dated Feb. 21, 2014, 8 pages.
Notice of Allowance for U.S. Appl. No. 13/370,500, dated Sep. 22, 2014, 10 pages.
Notice of Allowance for U.S. Appl. No. 13/442,146, dated Jul. 7, 2015, 7 pages.
Notice of Allowance for U.S. Appl. No. 13/618,496, dated Mar. 22, 2013, 8 pages.
Notice of Allowance for U.S. Appl. No. 13/708,763, dated Feb. 20, 2014, 9 pages.
Notice of Allowance for U.S. Appl. No. 13/708,791, dated Oct. 31, 2014, 8 pages.
Notice of Allowance for U.S. Appl. No. 13/739,989, dated Sep. 30, 2014, 9 pages.
Notice of Allowance for U.S. Appl. No. 14/512,224, dated Jan. 30, 2015, 8 pages.
Notice of Allowance for U.S. Appl. No. 14/678,737, dated Oct. 27, 2015, 18 pages.
Final Office Action for U.S. Appl. No. 14/935,145, dated Oct. 25, 2016, 28 pages.
Non-Final Office Action for U.S. Appl. No. 14/935,145, dated Sep. 22, 2017, 34 pages.
Final Office Action for U.S. Appl. No. 14/935,145, dated May 20, 2018, 25 pages.
Non-Final Office Action for U.S. Appl. No. 14/935,145, dated Nov. 30, 2018, 7 pages.
Final Office Action for U.S. Appl. No. 12/819,534, dated Jan. 20, 2016.
Final Office Action for U.S. Appl. No. 13/678,389, dated Feb. 4, 2016.
Non-Final Office Action for U.S. Appl. No. 13/678,389, dated Sep. 14, 2016.
Non-Final Office Action for U.S. Appl. No. 14/887,021, dated May 24, 2016.
Final Office Action for U.S. Appl. No. 13/894,245, dated Feb. 5, 2016.
Non-Final Office Action for U.S. Appl. No. 13/894,245, dated Sep. 7, 2016, 2016.
Final Office Action for U.S. Appl. No. 13/894,254, dated May 19, 2017, 17 pages.
Non-Final Office Action for U.S. Appl. No. 14/887,021, dated Feb. 18, 2016.
Final Office Action for U.S. Appl. No. 14/887,021, dated Nov. 18, 2016.
Non-Final Office Action for U.S. Appl. No. 14/935,145, dated Mar. 17, 2016.
Non-Final Office Action for U.S. Appl. No. 14/979,889, dated Jul. 1, 2016.
European Search Report for Application No. 10849171.3, dated Aug. 9, 2016, 11 pages.
Non-Final Office Action for U.S. Appl. No. 15/391,659, dated Jul. 27, 2017, 7 pages.
Non-Final Office Action for U.S. Appl. No. 14/887,021 , dated Jul. 20, 2017, 10 pages.
Final Office Action for U.S. Appl. No. 14/887,021, dated Mar. 9, 2018, 13 pages.

(56) References Cited

OTHER PUBLICATIONS

Non-Final Office Action for U.S. Appl. No. 14/887,021, dated Jun. 15, 2018, 9 pages.
Non-Final Office Action for U.S. Appl. No. 13/894,245, dated Jan. 8, 2018, 18 pages.
Final Office Action for U.S. Appl. No. 13/894,245, dated May 16, 2018, 14 pages.
Non-Final Office Action for U.S. Appl. No. 15/595,391, dated Mar. 5, 2019, 15 pages.
Office Action for European Application No. 18208211.5, dated Mar. 6, 2020, 5 pages.
Office Action for German Application No. 112011103244.7, dated Feb. 20, 2020, 5 pages (translation).
European office action dated Jun. 16, 2020, for EP Application No. 16194680.1, five pages.

* cited by examiner

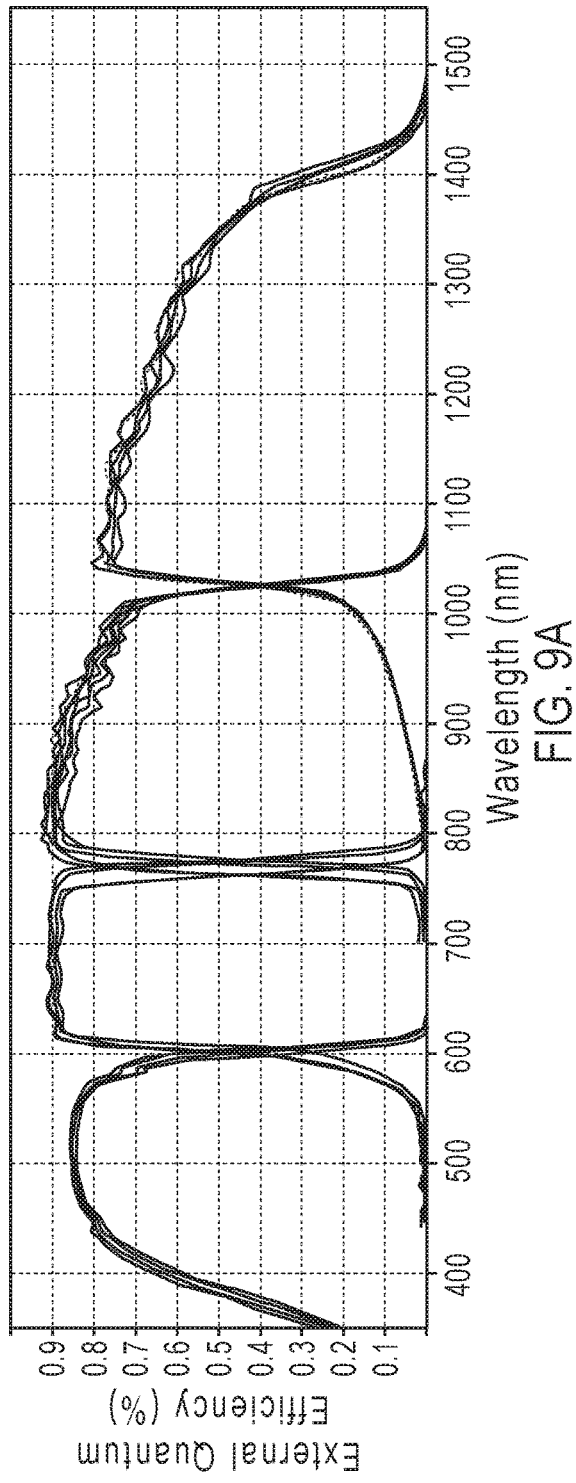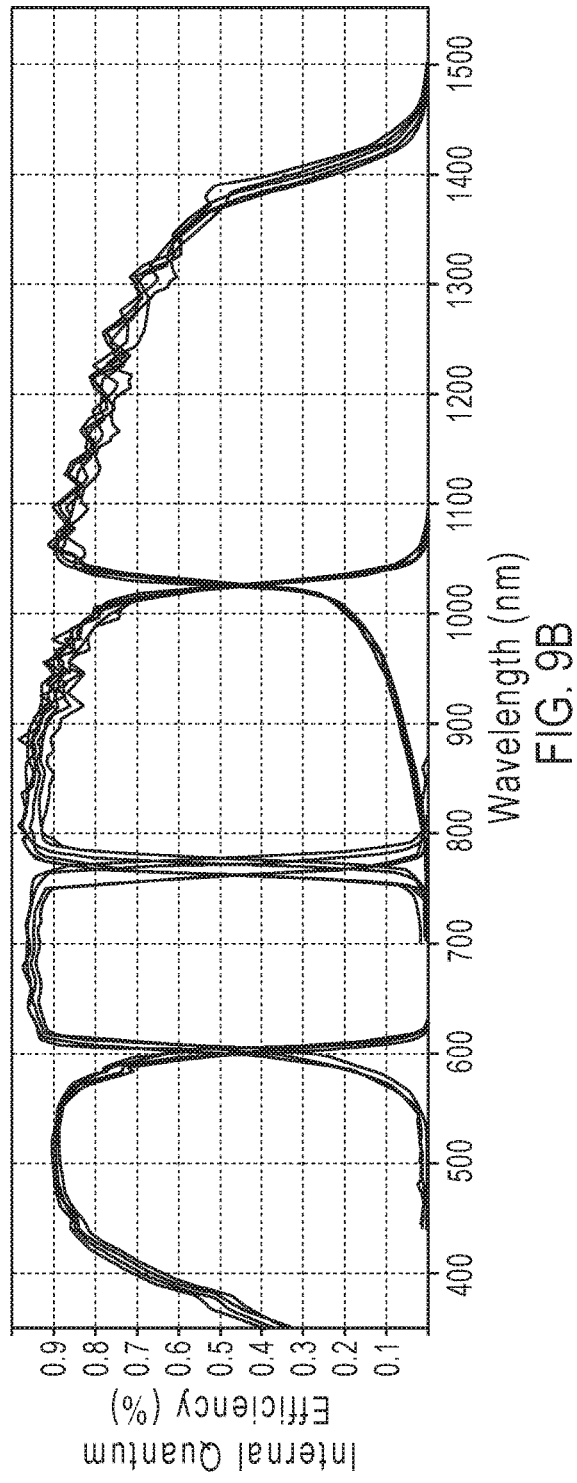

| Layer Name | Layer Function |
|---|---|
| InGaAs | iInGaAs Contact |
| InAlP | FSF (Front Surface Field) |
| AlGaInP | Emitter |
| AlGaInP | Base |
| AlGaInP | BSF (Back Surface Field) |
| AlGaAs | Tunnel Junction |
| GaAs | Tunnel Junction |
| AlGaInP | FSF (Front Surface Field) |
| AlGaAs | Emitter |
| AlGaAs | Base |
| AlGaAs | BSF (Back Surface Field) |
| InGaAs | Tunnel Junction |
| InGaAs | Tunnel Junction |
| InGaAs | Emitter |
| GaInNAsSb | Base |
| GaInNAsSb | Base |
| InGaAs | BSF (Back Surface Field) |
| InGaAs | Tunnel Junction |
| InGaAs | Tunnel Junction |
| InGaAs | BSF (Back Surface Field) |
| InGaP | III-V Nucleation |
| (Se,Sn) Ge | Substrate, Base |

FIG. 10

HIGH EFFICIENCY MULTIJUNCTION PHOTOVOLTAIC CELLS

This application is a divisional of U.S. application Ser. No. 14/887,021, filed on Oct. 19, 2015, which is incorporated by reference in its entirety.

FIELD

The present invention relates to multijunction photovoltaic cells having at least three subcells, in which at least one of the subcells comprises a base layer formed of GaInNAsSb. The GaInNAsSb subcells exhibit high internal quantum efficiencies over a broad range of irradiance energies.

BACKGROUND

The present invention relates to photovoltaic cells, and in particular to high efficiency, multijunction photovoltaic cells comprising at least one GaInNAsSb subcell.

High efficiency photovoltaic cell efficiencies have been produced by multijunction photovoltaic cells comprising GaInNAsSb. The high efficiencies of these photovoltaic cells make them attractive for terrestrial concentrating photovoltaic systems and for systems designed to operate in space.

High efficiency photovoltaic cells have consisted of a monolithic stack of three subcells, which are equivalently referred to as junctions, grown on germanium (Ge) or gallium arsenide (GaAs) substrates. The subcells contain the regions of the photovoltaic cell where light energy in a range of wavelengths is absorbed and converted into electrical energy that may be collected externally. The subcells may be interconnected to one another by tunnel junctions. Other layers, such as buffer layers, may also be present between the subcells. In certain photovoltaic cells, the top subcell has one or more absorbing layers made of (Al)InGaP, the intermediate subcell has one or more absorbing layers made of (In)GaAs, and the bottom subcell includes a Ge substrate or has absorbing layers made of a III-V material. The foregoing nomenclature for a III-V alloy, wherein a constituent element is shown parenthetically, such as Al in (Al)InGaP, denotes a condition of variability in which the element in parenthesis can be zero.

Each subcell can comprise several associated layers, such as a window (front surface field, FSF), emitter, base, and back surface field (BSF). Each of the foregoing layers may itself include one or more sublayers. The emitter and the base of a subcell are either formed of the same material, or the emitter is formed of a material with a different band gap than that of the base. Emitter-base pairs that are formed of the same material (such as InGaP emitter/InGaP base or AlInGaP emitter/AlInGaP base) are referred to as homojunctions. Emitter-base formed of different materials are either heterojunctions (such as InGaP emitter/AlInGaP base) which can improve voltage, or reverse heterojunctions (such as InGaP emitter/AlInGaP base) which can reduce resistivity in the emitter). The window and emitter can be of one doping polarity (e.g., n-type) and the base and back surface field can be of the opposite polarity (e.g., p-type), with a p-n or n-p junction formed between the base and the emitter. If the base contains an intrinsic region in addition to an intentionally doped region, then it may be considered a p-i-n or n-i-p junction. By convention, the specific alloy and the band gap of a given subcell are considered to be the name and the band gap, respectively, of the material forming the base. The material used for the base may or may not also be used for the window, emitter and back surface field of a subcell. For example, a subcell comprising an AlInP window, an InGaP emitter, a GaAs base and an AlGaAs back surface field would be denoted a GaAs subcell and the associated band gap would be the GaAs band gap of 1.4 eV. A subcell comprising an AlInP window, an InGaP emitter, an InGaP base and an InGaP back surface field would be denoted an InGaP subcell, and the associated band gap would be that of the InGaP base. Ae subcell may include layers in addition to those listed above. Those skilled in the art will also recognize that subcells may also be constructed without one or more of the foregoing layers. For example, subcells may be constructed without a window or without a back surface field.

Specific elements within an alloy are sometimes expressed with parenthesis, indicating that the element may be included in the composition. For example, a subcell comprising (Al)InGaP may include any amount of Al or none at all, covering all ranges of compositions In, Ga and P, however, are present. Those skilled in the art will recognize that (Al)InGaP is different than AlInGaP. The latter indicates that the composition must include some amount of Al. Similarly, (Si,Sn)Ge indicates Si and Sn may be present or absent in the alloy composition while Ge is required; SiSnGe indicates that all three elements are present.

When discussing the stacking order of the subcells from top to bottom, the top subcell is defined to be the subcell closest to the light source during operation of the multijunction photovoltaic cell, and the bottom subcell is furthest from the light source. Relative terms like "above," "below," "upper," and "lower" also refer to position in the stack with respect to the light source. The order in which the subcells are grown is not relevant to this definition. The top subcell can also be denoted "J1," with "J2" being the second subcell from the top, "J3" being third from the top, and the highest number going to the bottom subcell.

Three junction photovoltaic cells are capable of achieving efficiencies of about 45% under concentrated light with a AM1.5D STD terrestrial spectrum and about 31% under a one sun AM0 STD space spectrum. To reach significantly higher efficiencies, additional junctions or subcells are needed. With additional subcells, photons can be absorbed more efficiently by materials with band gaps closer to incident photon energies, which are then able to convert more light energy into electrical energy rather than heat. In addition, the total photovoltaic cell current with additional subcells may be lower for a given amount of incident light, which may reduce series resistance losses. Another mechanism for increasing efficiency is to absorb a larger fraction of the photovoltaic spectrum with additional subcell(s). For many years, there has been widespread recognition of the need for higher numbers of junctions, such as photovoltaic cells having four, five or six junctions. There are additional challenges related to the increased number of tunnel junctions required to interconnect the additional subcells, including the loss of light by tunnel junction absorption.

There has long been interest in high efficiency, lattice-matched multijunction photovoltaic cells with four or more subcells, but suitable materials for creating high efficiencies while maintaining lattice matching among the subcells and to a substrate have previously been elusive. For example, U.S. Pat. No. 7,807,921 discusses the possibility of a four junction, lattice-matched photovoltaic cell with GaInNAs as the material for a 1.0 eV subcell. To overcome problems associated with finding feasible, lattice-matched structures, the patent teaches the use of metamorphic materials including a graded metamorphic layer of GaInNAs that is not lattice matched.

What is needed to continue the progress toward higher efficiency photovoltaic cells are designs for multijunction photovoltaic cells with four or more subcells that can reach higher efficiencies than can be practically attained with three junction photovoltaic cells. Substantially lattice-matched designs are desirable because they have proven reliability and because lattice-matched photovoltaic cells use less semiconductor material than do metamorphic photovoltaic cells, which require relatively thick buffer layers to accommodate differences in the lattice constants of the various materials. It is to be noted that the general understanding of "substantially lattice matched" is that the in-plane lattice constants of the materials in their fully relaxed states differ by less than 0.6% when the materials are present in thicknesses greater than 100 nm. Further, subcells that are substantially lattice matched to each other means that all materials in the subcells that are present in thicknesses greater than 100 nm have in-plane lattice constants in their fully relaxed states that differ by less than 0.6%. In an alternative meaning, substantially lattice matched refers to the strain. As such, base layers can have a strain from 0.1% to 6%, from 0.1% to 5%, from 0.1% to 4%, from 0.1 to 3%, from 0.1% to 2%, or from 0.1% to 1%; or can have strain less than 6%, less than 5%, less than 4%, less than 3%, less than 2%, or less than 1%. Strain refers to compressive strain and/or to tensile strain.

Three junction photovoltaic cells comprising a lattice matched GaInNAsSb subcell are disclosed in U.S. Application Publication No. 2010/0319764, which is incorporated by reference in its entirety. These and other data on single junctions and three junction photovoltaic cells comprising a GaInNAsSb subcell have been extrapolated using a validated computational model to four-, five-, and six-junction lattice matched GaInNAsSb photovoltaic cells. The composition of these GaInNAsSb photovoltaic cells is disclosed in U.S. Application Publication No. 2013/0118546, which is incorporated by reference in its entirety.

SUMMARY

Three, four, five or more junction photovoltaic cells comprising at least one GaInNAsSb subcell exhibiting a high internal quantum efficiency throughout a broad range of irradiance energies and exhibiting a short circuit current density Jsc and open circuit voltage Voc suitable for use in high efficiency multijunction photovoltaic cells are disclosed.

The invention includes multijunction photovoltaic cells comprising four, five or more subcells having efficiencies that can exceed those of known photovoltaic cells. The multijunction photovoltaic cells incorporate at least one subcell that has a base comprising a GaInNAsSb semiconductor material wherein the composition of the material is tailored for band gap and lattice constant. The GaInNAsSb subcells can comprise the bottom subcell and/or the subcell immediately adjacent to the bottom subcell in each of the multijunction photovoltaic cells provided by the present disclosure. Each of the subcells of the multijunction photovoltaic cells are substantially lattice-matched to each other. In certain embodiments, the subcells of the multijunction photovoltaic cells are substantially lattice-matched to a substrate, such as a Ge substrate or a GaAs substrate. A Ge substrate can also function as a sub-cell of a multijunction photovoltaic cell. In a specific embodiment two GaInNAsSb subcells of differing band gaps are fabricated in a single multijunction photovoltaic cell.

According to the invention, $Ga_{1-x}In_xN_yAs_{1-y-z}Sb_z$ subcell, wherein the $Ga_{1-x}In_xN_yAs_{1-y-z}Sb_z$ subcell is characterized by: an internal quantum efficiency of at least 70% at an irradiance energy from 1.38 eV to 1.27 eV, and an internal quantum efficiency of at least 80% at an irradiance energy from 1.38 eV to 1.30 eV; an internal quantum efficiency of at least 70% at an irradiance energy from 1.38 eV to 1.18 eV, and an internal quantum efficiency of at least 80% at an irradiance energy from 1.38 eV to 1.30 eV; an internal quantum efficiency of at least 70% at an irradiance energy from 1.38 eV to 1.10 eV, and an internal quantum efficiency of at least 80% at an irradiance energy from 1.38 eV to 1.18 eV; an internal quantum efficiency of at least 70% at an irradiance energy from 1.38 eV to 1.03 eV, and an internal quantum efficiency of at least 80% at an irradiance energy from 1.38 eV to 1.13 eV; or an internal quantum efficiency of at least 60% at an irradiance energy from 1.38 eV to 0.92 eV, an internal quantum efficiency of at least 70% at an irradiance energy from 1.38 eV to 1.03 eV, and an internal quantum efficiency of at least 80% at an irradiance energy from 1.38 eV to 1.08 eV; wherein the internal quantum efficiency is measured at a junction temperature of 25° C.

According to the invention, multijunction photovoltaic cells comprise from three to five subcells, wherein at least one of the subcells comprises the $Ga_{1-x}In_xN_yAs_{1-y-z}Sb_z$ semiconductor material or subcell provided by the present disclosure; and each of the subcells is lattice matched to each of the other subcells.

According to the invention, multijunction photovoltaic cells comprise a $Ga_{1-x}In_xN_yAs_{1-y-z}Sb_z$ subcell characterized by a bandgap from 0.9 eV to 1.1 eV; an (Al,In)GaAs subcell overlying the $Ga_{1-x}In_xN_yAs_{1-y-z}Sb_z$ subcell, wherein the (Al,In)GaAs subcell is characterized by a bandgap from 1.3 eV to 1.5 eV; and an (Al)InGaP subcell overlying the (Al,In)GaAs subcell, wherein the (Al)InGaP subcell is characterized by a bandgap from 1.8 eV to 2.10 eV; wherein, each of the subcells is lattice matched to each of the other subcells; and the multijunction photovoltaic cell is characterized by, an open circuit voltage Voc equal to or greater than 2.5 V; a short circuit current density Jsc equal to or greater than 12 mA/cm$^2$; a fill factor equal to or greater than 75%; and an efficiency of at least 28%, measured using a 1 sun AM1.5D or AM0 spectrum at a junction temperature of 25° C.

According to the invention, multijunction photovoltaic cells comprise a $Ga_{1-x}In_xN_yAs_{1-y-z}Sb_z$ subcell characterized by a bandgap from 0.9 eV to 1.05 eV; a (Al,In)GaAs subcell overlying the $Ga_{1-x}In_xN_yAs_{1-y-z}Sb_z$ subcell, wherein the (Al, In)GaAs subcell is characterized by a bandgap from 1.3 eV to 1.5 eV; and an (Al)InGaP subcell overlying the (Al,In)GaAs subcell, wherein the (Al)InGaP subcell is characterized by a bandgap from 1.85 eV to 2.05 eV; wherein, each of the subcells is lattice matched to each of the other subcells; and the multijunction photovoltaic cell is characterized by an open circuit voltage Voc equal to or greater than 2.5 V; a short circuit current density Jsc equal to or greater than 12 mA/cm$^2$; a fill factor equal to or greater than 70%; and an efficiency equal to or greater than 28%, measured using a 1 sun AM1.5D spectrum at a junction temperature of 25° C.

According to the invention, multijunction photovoltaic cells comprise a first subcell comprising (Al)InGaP; a second subcell comprising (Al,In)GaAs underlying the first subcell; a third subcell comprising $Ga_{1-x}In_xN_yAs_{1-y-z}Sb_z$ underlying the second subcell; and a fourth subcell comprising (Si,Sn)Ge underlying the third subcell; wherein, each of the subcells is lattice matched to each of the other subcells; the third subcell is characterized by a bandgap from 0.83 eV to 1.22 eV; and the third subcell is characterized by an internal quantum efficiency greater than 70% at an irradiance energy throughout the range from 0.95 eV to 1.55 eV at a junction temperature of 25° C.

According to the invention, multijunction photovoltaic cells comprise a first subcell comprising (Al)InGaP; a second subcell comprising (Al In)GaAs underlying the first subcell; a third subcell comprising $Ga_{1-x}In_xN_yAs_{1-y-z}Sb_z$ underlying the second subcell; and a fourth subcell comprising $Ga_{1-x}In_xN_yAs_{1-y-z}Sb_z$ underlying the third subcell; wherein, each of the subcells is lattice matched to each of the other subcells; each of the fourth subcell and the third subcell is characterized by a bandgap with a range from 0.83 eV to 1.3 eV; and each of the fourth subcell and the third subcell is characterized by an internal quantum efficiency greater than 70% at an irradiance energy throughout the range from 0.95 eV to 1.55 eV.

According to the invention, multijunction photovoltaic cells comprise a first subcell comprising (Al)InGaP; a second subcell comprising (Al,In)GaAs underlying the first subcell; a third subcell comprising $Ga_{1-x}In_xN_yAs_{1-y-z}Sb_z$ underlying the second subcell; a fourth subcell comprising $Ga_{1-x}In_xN_yAs_{1-y-z}Sb_z$ underlying the third subcell; a fifth subcell comprising (Si,Sn)Ge underling the fourth subcell; wherein, each of the subcells is lattice matched to each of the other subcells; each of the fourth subcell and the third subcell is characterized by a bandgap with a range from 0.83 eV to 1.3 eV; and each of the fourth subcell and the third subcell is characterized by an internal quantum efficiency greater than 70% at an irradiance energy throughout the range from 0.95 eV to 1.55 eV.

According to the invention, photovoltaic modules comprise at least one multijunction photovoltaic cell provided by the present disclosure.

According to the invention, photovoltaic systems comprise at least one multijunction photovoltaic cell provided by the present disclosure.

BRIEF DESCRIPTION OF THE DRAWINGS

Those skilled in the art will understand that the drawings described herein are for illustration purposes only. The drawings are not intended to limit the scope of the present disclosure.

FIG. 9A shows the external quantum efficiency for each subcell of a four-junction (Al)InGaP/(Al,In)GaAs/$Ga_{1-x}In_xN_yAs_{1-y-z}Sb_z$/$Ga_{1-x}In_xN_yAs_{1-y-z}Sb_z$ photovoltaic cell. The short circuit current density Jsc and band gap for each of the subcells are provided in Table 5.

FIG. 9B shows the internal quantum efficiency of each subcell of a four junction (Al)InGaP/(Al,In)GaAs/$Ga_{1-x}In_xN_yAs_{1-y-z}Sb_z$/$Ga_{1-x}In_xN_yAs_{1-y-z}Sb_z$ photovoltaic cell. The short circuit current density Jsc and band gap for each of the subcells are provided in Table 5.

FIG. 10 summarizes the composition and function of certain layers of a four-junction (Al)InGaP/(Al,In)GaAs/$Ga_{1-x}In_xN_yAs_{1-y-z}Sb_z$/Ge multijunction photovoltaic cell.

DETAILED DESCRIPTION

Figure 1:
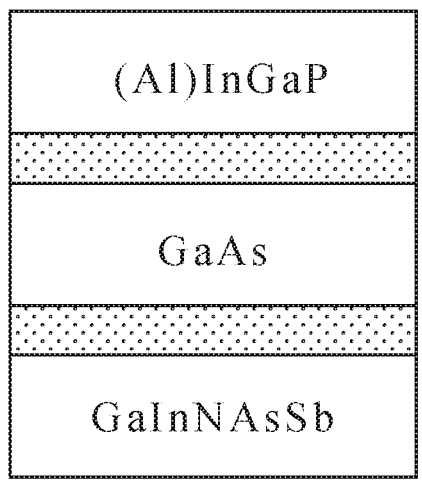
FIG. 1 is a schematic cross-section of a multijunction photovoltaic cell with three subcells according to embodiments of the present disclosure.

GaInNAsSb semiconductor materials are advantageous as photovoltaic cell materials because the lattice constant can be varied to be substantially matched to a broad range of substrates and/or subcells formed from other than GaInNAsSb materials. The lattice constant can be controlled by the relative fractions of the different group IIIA and group VA elements. Thus, by tailoring the compositions (i.e., the elements and quantities) of a GaInNAsSb material, a wide range of lattice constants and band gaps may be obtained. Further, high quality material may be obtained by optimizing the composition around a specific lattice constant and band gap, while limiting the total Sb content to no more than 20 percent of the Group V lattice sites, in certain embodiments to no more than 3 percent of the Group V lattice sites, and in certain embodiments, to no more than 1 percent of the Group V lattice sites. Sb is believed to act as a surfactant to promote smooth growth morphology of the III-AsNV alloys. In addition, Sb can facilitate uniform incorporation of nitrogen and minimize the formation of nitrogen-related defects. The incorporation of Sb can enhance the overall nitrogen incorporation and reduce the alloy band gap, aiding the realization of lower band gap alloys. However, there are additional defects created by Sb and therefore it is desirable that the total concentration of Sb should be limited to no more than 20 percent of the Group V lattice sites. Further, the limit to the Sb content decreases with decreasing nitrogen content. Alloys that include In can have even lower limits to the total content because In can reduce the amount of Sb needed to tailor the lattice constant. For alloys that include In, the total Sb content may be limited to no more than 3 percent of the Group V lattice sites, and in certain embodiments, to no more than 1 percent of the Group V lattice sites. For example, $Ga_{1-x}In_xN_yAs_{1-y-z}Sb_z$, disclosed in U.S. Application Publication No. 2010/0319764, can produce a high quality material when substantially lattice-matched to a GaAs or Ge substrate in the composition range of $0.08 \leq x \leq 0.18$, $0.025 \leq y \leq 0.04$ and $0.001 \leq z \leq 0.03$, with a band gap of at least 0.9 eV.

In certain embodiments of $Ga_{1-x}In_xN_yAs_{1-y-z}Sb_z$ provided by the present disclosure, the N composition is not more than 7 percent of the Group V lattice sites. In certain embodiments the N composition is not more than 4 percent, and in certain embodiments, not more than 3 percent.

The present invention includes multijunction photovoltaic cells with three or more subcells such as three-, four- and five junction subcells incorporating at least one $Ga_{1-x}In_xN_yAs_{1-y-z}Sb_z$ subcell. The band gaps of the $Ga_{1-x}In_xN_yAs_{1-y-z}Sb_z$ materials can be tailored by varying the composition while controlling the overall composition of Sb. Thus, $Ga_{1-x}In_xN_yAs_{1-y-z}Sb_z$ subcell with a band gap suitable for integrating with the other subcells may be fabricated while maintaining substantial lattice-matching to the other subcells. The band gaps and compositions of the $Ga_{1-x}In_xN_yAs_{1-y-z}Sb_z$ subcells can be tailored so that the short-circuit current produced by the $Ga_{1-x}In_xN_yAs_{1-y-z}Sb_z$ subcells will be the same as or slightly greater than the short-circuit current of the other subcells in the photovoltaic cell. Because $Ga_{1-x}In_xN_yAs_{1-y-z}Sb_z$ materials provide high quality, lattice-matched and band gap tunable subcells, the disclosed photovoltaic cells comprising $Ga_{1-x}In_xN_yAs_{1-y-z}Sb_z$ subcells can achieve high conversion efficiencies s. The increased in efficiency is largely due to less light energy being lost as heat, as the additional subcells allow more of the incident photons to be absorbed by semiconductor materials with band gaps closer to the energy level of the incident photons. In addition, there will be lower series resistance losses in these multijunction photovoltaic cells compared with other photovoltaic cells due to the lower operating currents. At higher concentrations of sunlight, the reduced series resistance losses become more pronounced. Depending on the band gap of the bottom subcell, the collection of a wider range of photons in the solar spectrum may also contribute to the increased efficiency.

Designs of multijunction photovoltaic cells with more than three subcells in the prior art predominantly rely on metamorphic growth structures, new materials, or dramatic improvements in the quality of existing subcell materials in order to provide structures that can achieve high efficiencies. Photovoltaic cells containing metamorphic buffer layers may have reliability concerns due to the potential for dislocations originating in the buffer layers to propagate over time into the subcells, causing degradation in performance. In contrast, $Ga_{1-x}In_xN_yAs_{1-y-z}Sb_z$ materials can be used in photovoltaic cells with more than three subcells to attain high efficiencies while maintaining substantial lattice-matching between subcells, which is advantageous for reliability. For example, reliability testing on $Ga_{1-x}In_xN_yAs_{1-y-z}Sb_z$ subcells provided by the present disclosure has shown that multijunction photovoltaic cells comprise a $Ga_{1-x}In_xN_yAs_{1-y-z}Sb_z$ subcell, such devices can survive the equivalent of 390 years of on-sun operation at 100° C. with no failures. The maximum degradation observed in these subcells was a decrease in open-circuit voltage of about 1.2%.

For application in space, radiation hardness, which refers to minimal degradation in device performance when exposed to ionizing radiation including electrons and protons, is of great importance. Multijunction photovoltaic cells incorporating $Ga_{1-x}In_xN_yAs_{1-y-z}Sb_z$ subcells provided by the present disclosure have been subjected to proton radiation testing to examine the effects of degradation in space environments. Compared to Ge-based triple junction photovoltaic cells, the results demonstrate that these $Ga_{1-x}In_xN_yAs_{1-y-z}Sb_z$ containing devices have similar power degradation rates and superior voltage retention rates. Compared to non-lattice matched (metamorphic) triple junction photovoltaic cells, all metrics are superior for $Ga_{1-x}In_xN_yAs_{1-y-z}Sb_z$ containing devices. In certain embodiments, the photovoltaic cells include (Al) InGaP subcells to improve radiation hardness compared to (Al,In)GaAs subcells.

Due to interactions between the different elements, as well as factors such as the strain in the layer, the relationship between composition and band gap for $Ga_{1-x}In_xN_yAs_{1-y-z}Sb_z$ is not a simple function of composition. The composition that yields a desired band gap with a specific lattice constant can be found by empirically varying the composition.

The thermal dose applied to the $Ga_{1-x}In_xN_yAs_{1-y-z}Sb_z$ material, which is controlled by the intensity of heat applied for a given duration of time (e.g., application of a temperature of 600° C. to 900° C. for a duration of between 10 seconds to 10 hours), that a $Ga_{1-x}In_xN_yAs_{1-y-z}Sb_z$ material receives during growth and after growth, also affects the relationship between band gap and composition. In general, the band gap increases as thermal dose increases.

As development continues on $Ga_{1-x}In_xN_yAs_{1-y-z}Sb_z$ materials and photovoltaic cells comprising $Ga_{1-x}In_xN_yAs_{1-y-z}Sb_z$ subcells, it is expected that material quality will continue to improve, enabling higher efficiencies from the same or similar compositions described in the present disclosure. It should be appreciated, however, that because of the complex interdependence of the GaInNAsSb material composition and the processing parameters it cannot necessarily be determined which combination of materials and processing conditions will produce suitable high efficiency subcells having a particular band gap.

As the composition is varied within the $Ga_{1-x}In_xN_yAs_{1-y-z}Sb_z$ material system, the growth conditions need to be modified. For example, for (Al,In)GaAs, the growth temperature will increase as the fraction of Al increases and decrease as the fraction of In increases, in order to maintain the same material quality. Thus, as a composition of either the $Ga_{1-x}In_xN_yAs_{1-y-z}Sb_z$ material or the other subcells of the multijunction photovoltaic cell is changed, the growth temperature as well as other growth conditions can be adjusted accordingly.

Schematic diagrams of the three junction, four junction, and five junction photovoltaic cells are shown FIGS. 1, 2A, 2B, and 2C to create a complete multijunction photovoltaic cell, including an anti-reflection coating, contact layers, tunnel junction, electrical contacts and a substrate or wafer handle. As discussed herein, FIG. 10 shows an example structure with these additional elements. Further, additional elements may be present in a complete photovoltaic cell, such as buffer layers, tunnel junctions, back surface field, window, emitter, and front surface filed layers, FIG. 1 shows an example of a multijunction photovoltaic cell according to the invention that has three subcells, with the bottom subcell being a $Ga_{1-x}In_xN_yAs_{1-y-z}Sb_z$ subcell. All three subcells are substantially lattice-matched to each other and may be interconnected by tunnel junctions, which are shown as dotted regions. The $Ga_{1-x}In_xN_yAs_{1-y-z}Sb_z$ subcell at the bottom of the stack has the lowest band gap of the three subcells and absorbs the lowest-energy light that is converted into electricity by the photovoltaic cell. The band gap of the $Ga_{1-x}In_xN_yAs_{1-y-z}Sb_z$ material in the bottom subcell is between 0.7-1.1 eV. The upper subcells can comprise (Al)InGaP or AlInGaP.

Figure 2A:
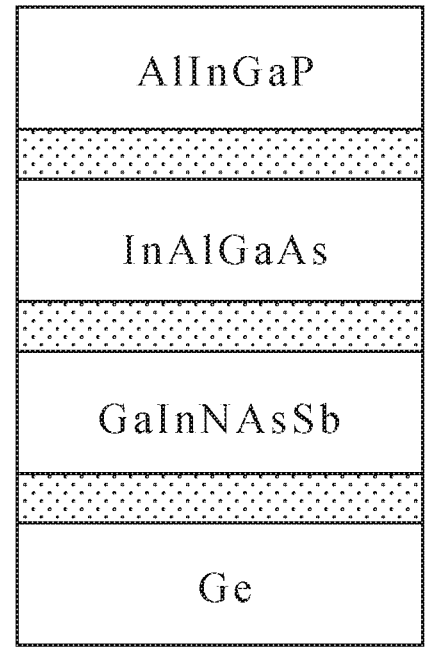
FIGS. 2A and 2B are schematic cross-sections of multijunction photovoltaic cells with four subcells according to embodiments of the present disclosure.

FIG. 2A shows a multijunction photovoltaic cell according to the invention that has four subcells, with the bottom subcell being a Ge subcell and an overlying subcell being a $Ga_{1-x}In_xN_yAs_{1-y-z}Sb_z$ subcell. All four subcells are substantially lattice-matched to each other and may be interconnected by two tunnel junctions, which are shown as dotted regions. The band gap of the $Ga_{1-x}In_xN_yAs_{1-y-z}Sb_z$ subcell can be between 0.7 eV and 1.1 eV. The upper subcells can comprise GaAs and either (Al,In)GaAs and (Al)InGaP.

Figure 2B:
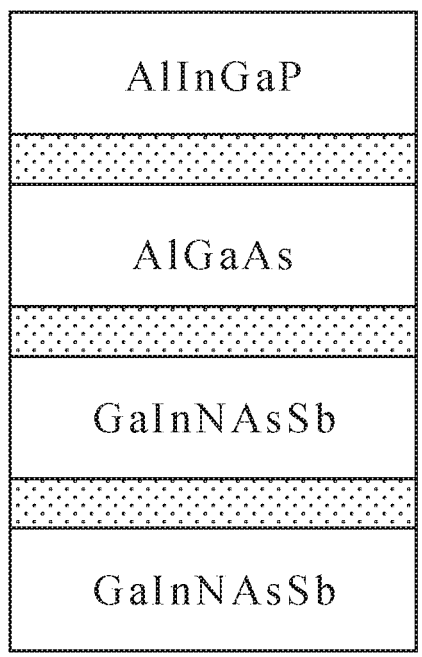
Figure 2C:
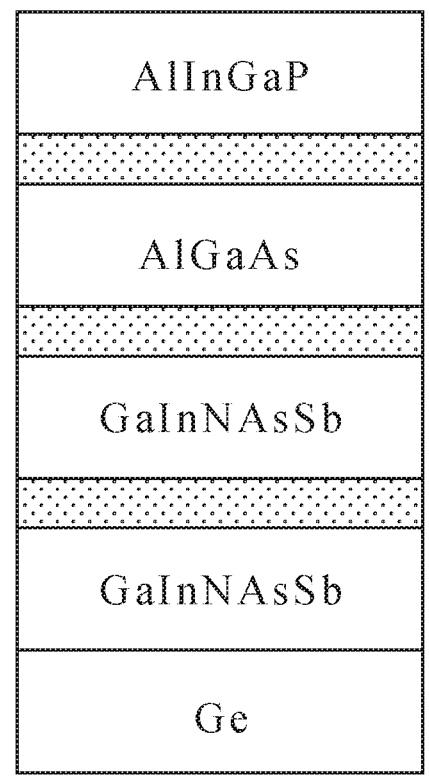
FIG. 2C is a schematic cross-section of a multijunction photovoltaic cell having four subcells according to embodiments of the present disclosure.

FIG. 2B shows a multijunction photovoltaic cell according to the invention that has four subcells, with the bottom subcell being a $Ga_{1-x}In_xN_yAs_{1-y-z}Sb_z$ subcell and an overlying subcell being a $Ga_{1-x}In_xN_yAs_{1-y-z}Sb_z$ subcell. All four subcells are substantially lattice-matched to each other and may be interconnected by tunnel junctions, which are shown as dotted regions. The band gap of the bottom $Ga_{1-x}In_xN_yAs_{1-y-z}Sb_z$ subcell is between 0.7 eV to 1.1 eV, and the band gap of the overlying $Ga_{1-x}In_xN_yAs_{1-y-z}Sb_z$ subcell is between 0.7 eV and 1.3 eV. The upper subcells can comprise (Al,In)GaAs and (Al)InGaP.

The specific band gaps of the subcells, within the ranges given in the preceding as well as subsequent embodiments, are dictated, at least in part, by the band gap of the bottom subcell, the thicknesses of the subcell layers, and the incident spectrum of light. Although there are numerous structures in the present disclosure that will produce efficiencies exceeding those of three junction photovoltaic cells, it is not the case that any set of subcell band gaps that falls within the disclosed ranges will produce an increased photovoltaic conversion efficiency. For a certain choice of bottom subcell band gap, or alternately the band gap of another subcell, incident spectrum of light, subcell materials, and subcell layer thicknesses, there is a narrower range of band gaps for the remaining subcells that will produce efficiencies exceeding those of other three junction photovoltaic cells.

In each of the embodiments described herein, the tunnel junctions are designed to have minimal light absorption. Light absorbed by tunnel junctions is not converted into electricity by the photovoltaic cell, and thus if the tunnel junctions absorb significant amounts of light, it will not be possible for the efficiencies of the multijunction photovoltaic cells to exceed those of the best triple junction photovoltaic cells. Accordingly, the tunnel junctions must be very thin (preferably less than 40 nm) and/or be made of materials with band gaps equal to or greater than the subcells immediately above the respective tunnel junction. An example of a tunnel junction fitting these criteria is a GaAs/AlGaAs tunnel junction, where each of the GaAs and AlGaAs layers forming the tunnel junction has a thickness between 5 nm and 15 nm. The GaAs layer can be doped with Te, Se, S and/or Si, and the AlGaAs layer can be doped with C.

In each of the embodiments described and illustrated herein, additional semiconductor layers are present in order to create a photovoltaic cell device. Specifically, cap or contact layer(s), anti-reflection coating (ARC) layers and electrical contacts (also denoted as the metal grid) can be formed above the top subcell, and buffer layer(s), the substrate or handle, and bottom contacts can be formed or be present below the bottom subcell. In certain embodiments, the substrate may also function as the bottom subcell, such as in a Ge subcell. Other semiconductor layers, such as additional tunnel junctions, may also be present. Multijunction photovoltaic cells may also be formed without one or more of the elements listed above, as known to those skilled in the art.

In operation, a multijunction photovoltaic cell is configured such that the subcell having the highest band gap faces the incident photovoltaic radiation, with subcells characterized by increasingly lower band gaps situated underlying or beneath the uppermost subcell.

In the embodiments disclosed herein, each subcell may comprise several layers. For example, each subcell may comprise a window layer, an emitter, a base, and a back surface field (BSF) layer.

In operation, the window layer is the topmost layer of a subcell and faces the incident radiation. In certain embodiments, the thickness of a window layer can be from about 10 nm to about 500 nm, from about 10 nm to about 300 nm, from about 10 nm to about 150 nm, and in certain embodiments, from about 10 nm to about 50 nm. In certain embodiments, the thickness of a window layer can be from about 50 nm to about 350 nm, from about 100 nm to about 300 nm, and in certain embodiments, from about 50 nm to about 150 nm.

In certain embodiments, the thickness of an emitter layer can be from about 10 nm to about 300 nm, from about 20 nm to about 200 nm, from about 50 nm to about 200 nm, and in certain embodiments, from about 75 nm to about 125 nm.

In certain embodiments, the thickness of a base layer can be from about 0.1 µm to about 6 µm, from about 0.1 µm to about 4 µm, from about 0.1 µm to about 3 µm, from about 0.1 µm to about 2 µm, and in certain embodiments, from about 0.1 µm to about 1 µm. In certain embodiments, the thickness of a base layer can be from about 0.5 µm to about 5 µm, from about 1 µm to about 4 µm, from about 1.5 µm to about 3.5 µm, and in certain embodiments, from about 2 µm to about 3 µm.

In certain embodiments the thickness of a BSF layer can be from about 10 nm to about 500 nm, from about 50 nm to about 300 nm, and in certain embodiments, from about 50 nm to about 150 nm.

In certain embodiments, an (Al)InGaP subcell comprises a window comprising AlInP, an emitter comprising (Al)InGaP, a base comprising (Al)InGaP, and a back surface field layer comprising AlInGaP.

In certain embodiments, an (Al)InGaP subcell comprises a window comprising AlInP having a thickness from 10 nm to 50 nm, an emitter comprising (Al)InGaP having a thickness from 20 nm to 200 nm, a base comprising (Al)InGaP having a thickness from 0.1 µm to 2 µm, and a BSF layer comprising AlInGaP having a thickness from 50 nm to 300 nm.

In certain of such embodiments, an (Al)InGaP subcell is characterized by a band gap from about 1.9 eV to about 2.2 eV.

In certain embodiments, an (Al,In)GaAs subcell comprises a window comprising (Al)In(Ga)P or (Al,In)GaAs, an emitter comprising (Al)InGaP or (Al,In)GaAs, a base comprising (Al,In)GaAs, and a BSF layer comprising (Al,In)GaAs or (Al)InGaP. In certain embodiments, an (Al,In)GaAs subcell comprises a window comprising (Al)InGaP having a thickness from 50 nm to 400 nm, an emitter comprising (Al,In)GaAs having a thickness from 100 nm to 200 nm, a base comprising (Al,In)GaAs having a thickness from 1 µm to 4 µm, and a BSF layer comprising (Al,In)GaAs having a thickness from 100 nm to 300 nm.

In certain embodiments, an (Al,In)GaAs subcell comprises a window comprising (Al)InGaP having a thickness from 200 nm to 300 nm, an emitter comprising (Al,In)GaAs having a thickness from 100 nm to 150 nm, a base comprising (Al,In)GaAs having a thickness from 2 µm to 3.5 µm, and a BSF layer comprising (Al,In)GaAs having a thickness from 150 nm to 250 nm.

In certain of such embodiments, an (Al,In)GaAs subcell is characterized by a band gap from about 1.4 eV to about 1.7 eV.

In certain embodiments, an (Al) InGaAsP subcell comprises a window comprising (Al)In(Ga)P, an emitter comprising (Al) InGaP or (Al) InGaAsP, a base comprising (Al) InGaAsP, and a BSF layer comprising (Al,In)GaAs or (Al)InGaP. In certain embodiments, an (Al) InGaAsP subcell comprises a window comprising (Al)In(Ga)P having a thickness from 50 nm to 300 nm, an emitter comprising (Al)InGaP or (Al) InGaAsP having a thickness from 100 nm to 200 nm, a base comprising (Al) InGaAsP having a thickness from 0.5 µm to 4 µm, and a BSF layer comprising Al(In)GaAs or (Al)InGaP having a thickness from 50 nm to 300 nm.

In certain of such embodiments, an (Al)InGaAsP subcell is characterized by a band gap from about 1.4 eV to about 1.8 eV.

In certain embodiments, a $Ga_{1-x}In_xN_yAs_{1-y-z}Sb_z$ subcell comprises a window comprising (Al)InGaP or (Al,In)GaAs, an emitter comprising (In)GaAs or a $Ga_{1-x}In_xN_yAs_{1-y-z}Sb_z$, a base comprising a $Ga_{1-x}In_xN_yAs_{1-y-z}Sb_z$, and a BSF layer comprising (In)GaAs.

In certain embodiments, a $Ga_{1-x}In_xN_yAs_{1-y-z}Sb_z$ subcell comprises a window comprising (Al)InGaP or (In)GaAs, having a thickness from 0 nm to 300 nm, an emitter comprising (In)GaAs or a $Ga_{1-x}In_xN_yAs_{1-y-z}Sb_z$ alloy having a thickness from 100 nm to 200 nm, a base comprising a $Ga_{1-x}In_xN_yAs_{1-y-z}Sb_z$ having a thickness from 1 µm to 4 µm, and a BSF layer comprising (In)GaAs having a thickness from 50 nm to 300 nm. In certain embodiments, a $Ga_{1-x}In_xN_yAs_{1-y-z}Sb_z$ alloy subcell comprises an emitter comprising InGaAs or a III-AsNV alloy having a thickness from 100 nm to 150 nm, a base comprising a $Ga_{1-x}In_xN_yAs_{1-y-z}Sb_z$ alloy having a thickness from 2 µm to 3 µm, and a BSF layer comprising (In)GaAs having a thickness from 50 nm to 200 nm.

In certain of such embodiments, a $Ga_{1-x}In_xN_yAs_{1-y-z}Sb_z$ subcell is characterized by a band gap from about 0.7 to about 1.1 eV, or about 0.9 eV to about 1.3 eV. In certain of such embodiments, the $Ga_{1-x}In_xN_yAs_{1-y-z}Sb_z$ subcell is a GaInNAsSb subcell.

In certain of such embodiments, a $Ga_{1-x}In_xN_yAs_{1-y-z}Sb_z$ subcell has a compressive strain of less than 0.6%, meaning that the in-plane lattice constant of the $Ga_{1-x}In_xN_yAs_{1-y-z}Sb_z$ material in its fully relaxed state is between 0.0% and 0.6% greater than that of the substrate. In certain of such embodiments, the $Ga_{1-x}In_xN_yAs_{1-y-z}Sb_z$ subcell contains Sb and does not contain Bi.

In certain embodiments, a Ge subcell comprises a window comprising (Al)InGaP or (Al,In)GaAs, having a thickness from 0 nm to 300 nm, an emitter comprising (Al,In)GaAs, (Al,Ga)InP, or $Ga_{1-x}In_xN_yAs_{1-y-z}Sb_z$, having a thickness from 10 nm to 500 nm, and a base comprising the Ge substrate. It is to be noted that multijunction photovoltaic cells may also be formed on a Ge or GaAs substrate wherein the substrate is not part of a subcell.

In certain embodiments, one or more of the subcells has an emitter and/or a base in which there is a graded doping profile. The doping profile may be linear, exponential or with other dependence on position. In certain of such embodiments, one or more of the $Ga_{1-x}In_xN_yAs_{1-y-z}Sb_z$ subcells has an exponential or linear doping profile over part or all of the base, with the doping levels between $1 \times 10^{15}$ and $1 \times 10^{19}$ cm$^{-3}$, or between $1 \times 10^{16}$ and $5 \times 10^{18}$ cm$^{-3}$. Further, the region of the $Ga_{1-x}In_xN_yAs_{1-y-z}Sb_z$ base that is closest to the emitter may have constant or no doping, as disclosed, for example, in U.S. Application Publication No. 2012/0103403, which is incorporated by reference in its entirety. Examples of dopants include, for example, Be, Mg, Zn, Te, Se, Si, C, and others known in the art.

A tunnel junction may be disposed between each of the subcells. Each tunnel junction comprises two or more layers that electrically connect adjacent subcells. The tunnel junction includes a highly doped n-type layer adjacent to a highly doped p-type layer to form a p-n junction. Typically, the doping levels in a tunnel junction are between $10^{18}$ cm$^{-3}$ and $10^{21}$ cm$^{-3}$.

In certain embodiments, a tunnel junction comprises an n-type (Al,In)GaAs or (Al)InGaP(As) layer and a p-type (Al,In)GaAs layer. In certain embodiments the dopant of the n-type layer comprises Si and the dopant of the p-type layer comprises C. A tunnel junction may have a thickness less than about 100 nm, less than 80 nm, less than 60 nm, less than 40 nm, and in certain embodiments, less than 20 nm. For example, in certain embodiments, a tunnel junction between (Al)InGaP subcells, between an (Al)InGaP subcell and an (Al,In)GaAs or (Al)InGaAsP subcell, or between (Al,In)GaAs subcells may have a thickness less than about 30 nm, less than about 20 nm, less than about 15 nm, and in certain embodiments, less than about 12 nm. In certain embodiments, a tunnel junction separating an (Al,In)GaAs and III-AsNV alloy subcell, separating adjacent III-AsNV alloy subcells, or separating a III-AsNV alloy and a (Si,Sn) Ge or Ge subcell may have a thickness less than 100 nm, less than 80 nm, less than 60 nm, and in certain embodiments, less than 40 nm.

A multijunction photovoltaic cell may be fabricated on a substrate such as a Ge substrate. In certain embodiments, the substrate can comprise GaAs, InP, Ge, or Si. In certain embodiments, all of the subcells are substantially lattice-matched to the substrate. In certain embodiments, one or more of the layers that are included within the completed photovoltaic cell but are not part of a subcell such as, for example, anti-reflective coating layers, contact layers, cap layers, tunnel junction layers, and buffer layers, are not substantially lattice-matched to the subcells.

In certain embodiments, the multijunction photovoltaic cell comprises an anti-reflection coating overlying the uppermost subcell. The materials comprising the anti-reflection coating and the thickness of the anti-reflection coating are selected to improve the efficiency of light capture in the multijunction photovoltaic cell. In certain embodiments, one or more contact layers overlie the uppermost subcell in the regions underlying or near the metal grid. In certain embodiments, the contact layers comprise (In)GaAs and the dopant may be Si or Be.

GaInNAsSb-containing multijunction photovoltaic cells provided by the present disclosure may be incorporated into a photovoltaic power system. A photovoltaic power system can comprise one or more photovoltaic cells provided by the present disclosure such as, for example, one or more photovoltaic cells having at least three, at least four subcells or at least five subcells, including one or more GaInNAsSb subcells. In certain embodiments, the one or more photovoltaic cells have a GaInNAsSb subcell as the bottom subcell or the subcell immediately above the bottom subcell. In certain embodiments, the photovoltaic power system may be a concentrating photovoltaic system, wherein the system may also comprise mirrors and/or lenses used to concentrate sunlight onto one or more photovoltaic cells. In certain embodiments, the photovoltaic power system comprises a single or dual axis tracker. In certain embodiments, the photovoltaic power system is designed for portable applications, and in other embodiments, for grid-connected power generation. In certain embodiments, the photovoltaic power system is designed to convert a specific spectrum of light, such as AM1.5G, AM1.5D or AM0, into electricity. In certain embodiments, the photovoltaic power system may be found on satellites or other extra-terrestrial vehicles and designed for operation in space without the influence of a planetary atmosphere on the impinging light source. In certain embodiments, the photovoltaic power system may be designed for operation on astronomical bodies other than earth. In certain embodiments, the photovoltaic power system may be designed for satellites orbiting about astronomical bodies other than earth. In certain embodiments, the photovoltaic power system may be designed for roving on the surface of an astronomical body other than earth.

Photovoltaic modules are provided comprising one or more multijunction photovoltaic cells provided by the present disclosure. A photovoltaic module may comprise one or more photovoltaic cells provided by the present disclosure to include an enclosure and interconnects to be used independently or assembled with additional modules to form a photovoltaic power system. A module and/or power system may include power conditioners, power converters, inverters and other electronics to convert the power generated by the photovoltaic cells into usable electricity. A photovoltaic module may further include optics for focusing light onto a photovoltaic cell provided by the present disclosure such as in a concentrated photovoltaic module. Photovoltaic power systems can comprise one or more photovoltaic modules, such as a plurality of photovoltaic modules.

In certain embodiments provided by the present disclosure, the semiconductor layers composing the photovoltaic cell, excepting the substrate, can be fabricated using molecular beam epitaxy (MBE) and/or chemical vapor deposition (CVD). In certain embodiments, more than one material deposition chamber is used for the deposition of the semiconductor layers comprising the photovoltaic cell. The materials deposition chamber is the apparatus in which the semiconductor layers composing the photovoltaic cell are deposited. The conditions inside the chamber may range from $10^{-11}$ Torr to $10^3$ Torr pressures. In certain embodiments the alloy constituents are deposited via physical and/or chemical processes. Each materials deposition chamber can have different configurations which allow for the deposition of different semiconductor layers and can be independently controlled from other materials deposition chambers. The semiconductor layers may be fabricated using metal organic chemical vapor deposition (MOCVD), MBE, or by other methods, including a combination of any of the foregoing.

The movement of the substrate and semiconductor layers from one materials deposition chamber to another is defined as the transfer. For example, a substrate is placed in a first materials deposition chamber, and then the buffer layer(s) and the bottom subcell(s) are deposited. Then the substrate and semiconductor layers are transferred to a second materials deposition chamber where the remaining subcells are deposited. The transfer may occur in vacuum, at atmospheric pressure in air or another gaseous environment, or in any environment in between. The transfer may further be between materials deposition chambers in one location, which may or may not be interconnected in some way, or may involve transporting the substrate and semiconductor layers between different locations, which is known as transport. Transport may be done with the substrate and semiconductor layers sealed under vacuum, surrounded by nitrogen or another gas, or surrounded by air. Additional semiconductor, insulating or other layers may be used as surface protection during transfer or transport, and removed after transfer or transport before further deposition.

In certain embodiments provided by the present disclosure, a plurality of layers is deposited on a substrate in a first materials deposition chamber. The plurality of layers may include etch stop layers, release layers (i.e., layers designed to release the semiconductor layers from the substrate when a specific process sequence, such as chemical etching, is applied), contact layers such as lateral conduction layers, buffer layers, or other semiconductor layers. In one specific embodiment, the sequence of layers deposited is buffer layer(s), then release layer(s), and then lateral conduction or contact layer(s). Next the substrate is transferred to a second materials deposition chamber where one or more subcells are deposited on top of the existing semiconductor layers. The substrate may then be transferred to either the first materials deposition chamber or to a third materials deposition chamber for deposition of one or more subcells and then deposition of one or more contact layers. Tunnel junctions are also formed between the subcells.

In certain embodiments provided by the present disclosure, the GaInNAsSb subcells are deposited in a first materials deposition chamber, and the (Al)InGaP, (Al,In)GaAs and (Al)InGaAsP subcells are deposited in a second materials deposition chamber, with tunnel junctions formed between the subcells. In a related embodiment of the invention, GaInNAsSb layers are deposited in a first materials deposition chamber, and other semiconductor layers that contain Al are deposited in a second materials deposition chamber. In another embodiment of the invention, a transfer occurs in the middle of the growth of one subcell, such that the said subcell has one or more layers deposited in one materials deposition chamber and one or more layers deposited in a second materials deposition chamber.

In certain embodiments provided by the present disclosure, some or all of the layers composing the GaInNAsSb subcells and the tunnel junctions are deposited in one materials deposition chamber by molecular beam epitaxy (MBE), and the remaining layers of the photovoltaic cell are deposited by chemical vapor deposition in another materials deposition chamber. For example, a substrate is placed in a first materials deposition chamber and layers that may include nucleation layers, buffer layers, emitter and window layers, contact layers and a tunnel junction are grown on the substrate, followed by one or more GaInNAsSb subcells. If there is more than one GaInNAsSb subcell, then a tunnel junction is grown between adjacent subcells. One or more tunnel junction layers may be grown, and then the substrate is transferred to a second materials deposition chamber where the remaining photovoltaic cell layers are grown by chemical vapor deposition. In certain embodiments, the chemical vapor deposition system is a MOCVD system. In a related embodiment of the invention, a substrate is placed in a first materials deposition chamber and layers that may include nucleation layers, buffer layers, emitter and window layers, contact layers and a tunnel junction are grown on the substrate by chemical vapor deposition. Subsequently, the top subcells, two or more, are grown on the existing semiconductor layers, with tunnel junctions grown between the subcells. Part of the topmost GaInNAsSb subcell, such as the window layer, may then be grown. The substrate is then transferred to a second materials deposition chamber where the remaining semiconductor layers of the topmost GaInNAsSb subcell may be deposited, followed by up to three more GaInNAsSb subcells, with tunnel junctions between them.

In certain embodiments provided by the present disclosure, the photovoltaic cell is subjected to one or more thermal annealing treatments after growth. For example, a thermal annealing treatment includes the application of a temperature of 400° C. to 1000° C. for between 10 seconds and 10 hours. Thermal annealing may be performed in an atmosphere that includes air, nitrogen, arsenic, arsine, phosphorus, phosphine, hydrogen, forming gas, oxygen, helium and any combination of the preceding materials. In certain embodiments, a stack of subcells and associated tunnel junctions may be annealed prior to fabrication of additional subcells.

An example of the multiple layer structure of a four junction photovoltaic cell is shown in FIG. 10. The four junction photovoltaic cell shown in FIG. 10 includes active (Si,Sn)Ge, GaInNAsSb, (Al,In)GaAs, and (Al)InGaP subcells. The four junction photovoltaic cell shown in FIG. 10 can be fabricated using MBE/MOCVD processing steps. A Ge substrate is provided and oxide is removed by annealing at a temperature greater than 600° C. for at least 10 minutes. A Si-doped (Al)InGaP nucleation layer is then deposited. A Si-doped I(Al,In)GaAs lattice matched back surface field layer is grown over the Si-doped (Al)InGaP nucleation layer. A tunnel junction is formed by providing epitaxial layers of Si-doped (Al,In)GaAs and C-doped (Al,In)GaAs. A back surface field (BSF) layer of Be-doped (Al,In)GaAs is grown over the tunnel junction. The second subcell comprises a GaInNAsSb base layer grown over a Ge-doped GaInNAsSb layer having a graded doping profile. A Si-doped (Al,In)GaAs emitter layer overlies the GaInNAsSb base and a second tunnel junction formed of a layer of Si-doped (Al,In)GaAs and a layer of C-doped (Al,In)GaAs are grown over the emitter.

The third subcell is then grown over the second GaInNAsSb subcell. A Be-doped (Al,In)GaAs BSF layer is grown over the second tunnel junction followed by a Be-doped (Al,In)GaAs base layer and a Si-doped (Al,In)GaAs emitter layer. A Si-doped (Al)GaInP front surface filed (FSF) layer is grown over the Si-doped (Al,In)GaAs emitter. Both the (Al,In)GaAs base layer and the FSF layer are characterized by graded doping profiles. A tunnel junction comprising a Si-doped (Al,In)GaAs layer and a carbon-doped (Al,In)GaAs layer overly the FSF layer.

The fourth subcell is formed by depositing a Be-doped (Al)GaInP BSF layer over the (Al,In)GaAs/(Al,In)GaAs tunnel junction. A Be-doped (Al)GaInP base layer is grown over the BSF layer, followed by a Si-doped (Al)GaInP emitter layer characterized by a graded doping profile. A Si-doped InAlP FSF layer is grown over the (Al)GaInP layer.

A Si-doped (Al,In)GaAs contact layer is grown over the topmost InAlP FSF layer.

The layers are grown by MBE or MOCVD methods known to those skilled in the art using suitable conditions such, for example, pressure, concentration, temperature, and time to provide high quality multijunction photovoltaic cells. Each of the base layers is lattice matched to each of the other base layers and to the Ge substrate.

Various values for band gaps, short circuit current density Jsc and open circuit voltage Voc have been recited in the description and in the claims. It should be understood that these values are not exact. However, the values for band gaps can be approximated to one significant figure to the right of the decimal point, except where otherwise indicated. Thus, the value 0.9 covers the range 0.850 to 0.949. Also various numerical ranges have been recited in the description and in the claims. It should be understood that the numerical ranges are intended to include all sub-ranges encompassed by the range. For example, a range of "from 1 to 10" is intended to include all sub-ranges between and including the recited minimum value of 1 and the recited maximum value of 10, such as having a minimum value equal to or greater than 1 and a maximum value equal to or less than 10.

Three-, four-, and five junction photovoltaic cells comprising at least one $Ga_{1-x}In_xN_yAs_{1-y-z}Sb_z$ subcell have been fabricated. The ability to provide high efficiency $Ga_{1-x}In_xN_yAs_{1-y-z}Sb_z$-based photovoltaic cells is predicated on the ability to provide a high quality $Ga_{1-x}In_xN_yAs_{1-y-z}Sb_z$ subcell that can be lattice matched to a variety of semiconductor materials including Ge and GaAs and that can be tailored to have a band gap within the range of 0.8 eV to 1.3 eV.

$Ga_{1-x}In_xN_yAs_{1-y-z}Sb_z$ subcells provided by the present disclosure are fabricated to provide a high internal quantum efficiency. Factors that contribute to providing a high internal quantum efficiency $Ga_{1-x}In_xN_yAs_{1-y-z}Sb_z$ subcells include, for example, the band gaps of the individual subcells, which in turn depends on the semiconductor composition of the subcells, doping levels and doping profiles, thicknesses of the subcells, quality of lattice matching, defect densities, growth conditions, annealing temperatures and profiles, and impurity levels.

Various metrics can be used to characterize the quality of a GaInNAsSb subcell including, for example, the Eg/q-Voc, the internal quantum efficiency over a range of irradiance energies, the open circuit voltage Voc and the short circuit current density Jsc. The open circuit voltage Voc and short circuit current Jsc can be measured on subcells having a $Ga_{1-x}In_xN_yAs_{1-y-z}Sb_z$ base layer that is 2 μm thick or other thickness such as, for example, a thickness from 1 μm to 4 μm. Those skilled in the art would understand how to extrapolate the open circuit voltage Voc and short circuit current Jsc measured for a subcell having a particular $Ga_{1-x}In_xN_yAs_{1-y-z}Sb_z$ base thickness to other thicknesses.

Figure 3:
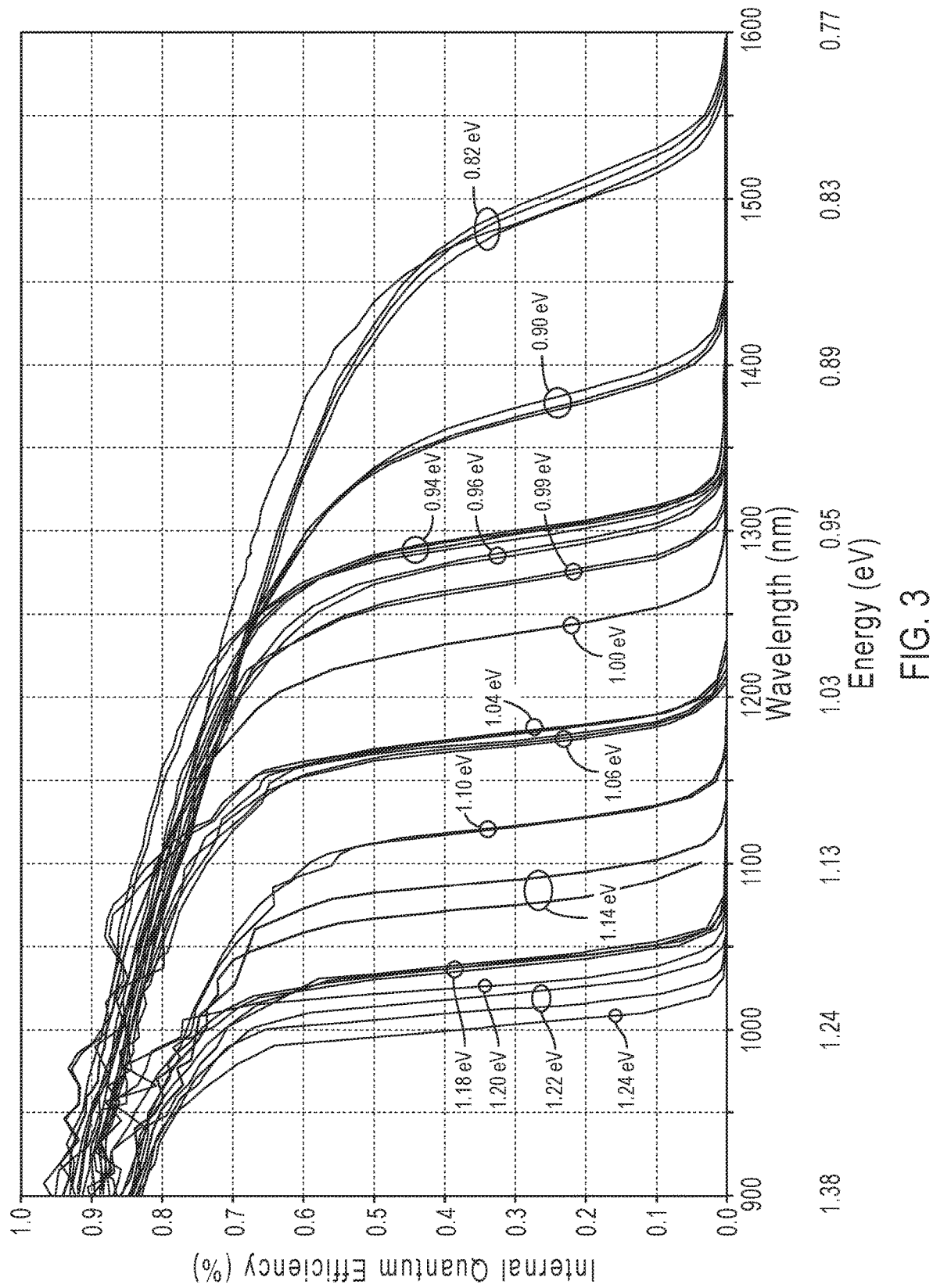
FIG. 3 shows the internal quantum efficiency as a function of irradiance wavelength for GaInNAsSb subcells having different band gaps from 0.82 eV to 1.24 eV.

The quality of a $Ga_{1-x}In_xN_yAs_{1-y-z}Sb_z$ subcell can be reflected by a curve of the internal quantum efficiency as a function of irradiance wavelength or irradiance energy. In general, a high quality $Ga_{1-x}In_xN_yAs_{1-y-z}Sb_z$ subcell exhibits an internal quantum efficiency (IQE) of at least 60%, at least 70% or at least 80% over a wide range of irradiance wavelengths. FIG. 3 shows the dependence of the internal quantum efficiency as a function of irradiance wavelength/energy for $Ga_{1-x}In_xN_yAs_{1-y-z}Sb_z$ subcells having band gaps from about 0.82 eV to about 1.24 eV.

The irradiance wavelengths for which the internal quantum efficiencies of the $Ga_{1-x}In_xN_yAs_{1-y-z}Sb_z$ subcell referred to in FIG. 3 is greater than 70% and greater than 80% is summarized in Table 1.

TABLE 1

Dependence of internal quantum efficiency of $Ga_{1-x}In_xN_yAs_{1-y-z}Sb_z$ subcells.

| GaInNAsSb Band Gap | | Internal Quantum Efficiency (nm/eV) | | | |
|---|---|---|---|---|---|
| Wavelength (nm) | Energy (eV) | >70% | | >80% | |
| 1000 | 1.24 | <900/<1.38 | 970/1.27  | <900/<1.38 | 930/1.33 |
| 1088 | 1.14 | <900/<1.38 | 1000/1.24 | <900/<1.38 | 950/1.30 |
| 1127 | 1.10 | <900/<1.38 | 1050/1.18 | <900/<1.38 | 950/1.30 |
| 1181 | 1.05 | <900/<1.38 | 1100/1.13 | <900/<1.38 | 1050/1.18 |
| 1240 | 1.00 | <900/<1.38 | 1150/1.08 | <900/<1.38 | 1100/1.13 |
| 1291 | 0.96 | <900/<1.38 | 1200/1.03 | <900/<1.38 | 1100/1.13 |
| 1512 | 0.82 | <900/<1.38 | 1250/0.99 | <900/<1.38 | 1100/1.13 |

The $Ga_{1-x}In_xN_yAs_{1-y-z}Sb_z$ subcells measured in FIG. 3 exhibit high internal quantum efficiencies greater than 60%, greater than 70%, or greater than 80% over a broad irradiance wavelength range. The high internal quantum efficiency of these $Ga_{1-x}In_xN_yAs_{1-y-z}Sb_z$ subcells over a broad range of irradiance wavelengths/energies is indicative of the high quality of the semiconductor material forming the $Ga_{1-x}In_xN_yAs_{1-y-z}Sb_z$ subcell.

As shown in FIG. 3, the range of irradiance wavelengths over which a particular $Ga_{1-x}In_xN_yAs_{1-y-z}Sb_z$ subcell exhibits a high internal quantum efficiency is bounded by the band gap of a particular $Ga_{1-x}In_xN_yAs_{1-y-z}Sb_z$ subcell. Measurements are not extended to wavelengths below 900 nm because in a practical photovoltaic cell, a Ge subcell can be used to capture and convert radiation at the shorter wavelengths. The internal quantum efficiencies in FIG. 3 were measured at an irradiance of 1 sun (1,000 W/m²) with the AM1.5D spectrum at a junction temperature of 25° C., for a GaInNAsSb subcell thickness of 2 µm. One skilled in the art will understand how to extrapolate the measured internal quantum efficiencies to other irradiance wavelengths/energies, subcell thicknesses, and temperatures. The internal quantum efficiency was measured by scanning the spectrum of a calibrated source and measuring the current generated by the photovoltaic cell. A GaInNAsSb subcell can include a GaInNAsSb subcell base, an emitter, a back surface field and a front surface field.

The $Ga_{1-x}In_xN_yAs_{1-y-z}Sb_z$ subcells exhibited an internal quantum efficiency as follows:

an internal quantum efficiency of at least 70% at an irradiance energy from 1.38 eV to 1.30 eV, and an internal quantum efficiency of at least 80% at an irradiance energy from 1.38 eV to 1.30 eV; 1.18-1.24 an internal quantum efficiency of at least 70% at an irradiance energy from 1.38 eV to 1.18 eV, and an internal quantum efficiency of at least 80% at an irradiance energy from 1.38 eV to 1.30 eV; 1.10-1.14 an internal quantum efficiency of at least 70% at an irradiance energy from 1.38 eV to 1.10 eV, and an internal quantum efficiency of at least 80% at an irradiance energy from 1.38 eV to 1.18 eV; 1.04-1.06 an internal quantum efficiency of at least 70% at an irradiance energy from 1.38 eV to 1.03 eV, and an internal quantum efficiency of at least 80% at an irradiance energy from 1.38 eV to 1.15 eV; 0.99-1.01 an internal quantum efficiency of at least 70% at an irradiance energy from 1.38 eV to 0.99 eV, and an internal quantum efficiency of at least 80% at an irradiance energy from 1.38 eV to 1.15 eV; or 0.90-0.98 an internal quantum efficiency of at least 60% at an irradiance energy from 1.38 eV to 0.92 eV, an internal quantum efficiency of at least 70% at an irradiance energy from 1.38 eV to 1.03 eV, and an internal quantum efficiency of at least 80% at an irradiance energy from 1.38 eV to 1.15 eV; 0.82 wherein the internal quantum efficiency was measured at a junction temperature of 25° C.

$Ga_{1-x}In_xN_yAs_{1-y-z}Sb_z$ subcells having a band gap between 1.18 eV and 1.24 eV, exhibited an internal quantum efficiency an internal quantum efficiency of at least 70% at an irradiance energy from 1.38 eV to 1.30 eV, and an internal quantum efficiency of at least 80% at an irradiance energy from 1.38 eV to 1.30 eV, measured at a junction temperature of 25° C.

$Ga_{1-x}In_xN_yAs_{1-y-z}Sb_z$ subcells having a band gap between 1.10 eV and 1.14 eV, exhibited an internal quantum efficiency of at least 70% at an irradiance energy from 1.38 eV to 1.18 eV, and an internal quantum efficiency of at least 80% at an irradiance energy from 1.38 eV to 1.30 eV, measured at a junction temperature of 25° C.

$Ga_{1-x}In_xN_yAs_{1-y-z}Sb_z$ subcells having a band gap between 1.04 eV and 1.06 eV, exhibited an internal quantum efficiency of at least 70% at an irradiance energy from 1.38 eV to 1.10 eV, and an internal quantum efficiency of at least 80% at an irradiance energy from 1.38 eV to 1.18 eV, measured at a junction temperature of 25° C.

$Ga_{1-x}In_xN_yAs_{1-y-z}Sb_z$ subcells having a band gap between 0.99 eV and 1.01 eV, exhibited an internal quantum efficiency of at least 70% at an irradiance energy from 1.38 eV to 1.03 eV, and an internal quantum efficiency of at least 80% at an irradiance energy from 1.38 eV to 1.15 eV, measured at a junction temperature of 25° C.

$Ga_{1-x}In_xN_yAs_{1-y-z}Sb_z$ subcells having a band gap between 0.90 eV and 0.98 eV, exhibited an internal quantum efficiency of at least 70% at an irradiance energy from 1.38 eV to 0.99 eV, and an internal quantum efficiency of at least 80% at an irradiance energy from 1.38 eV to 1.15 eV, measured at a junction temperature of 25° C.

$Ga_{1-x}In_xN_yAs_{1-y-z}Sb_z$ subcells having a band gap between 0.80 eV and 0.86 eV, exhibited an internal quantum efficiency of at least 60% at an irradiance energy from 1.38 eV to 0.92 eV, an internal quantum efficiency of at least 70% at an irradiance energy from 1.38 eV to 1.03 eV, and an internal quantum efficiency of at least 80% at an irradiance energy from 1.38 eV to 1.15 eV, measured at a junction temperature of 25° C.

The $Ga_{1-x}In_xN_yAs_{1-y-z}Sb_z$ subcells also exhibited an internal quantum efficiency as follows:

an internal quantum efficiency of at least 70% at an irradiance energy from 1.38 eV to 1.27 eV, and an internal quantum efficiency of at least 80% at an irradiance energy from 1.38 eV to 1.30 eV;

an internal quantum efficiency of at least 70% at an irradiance energy from 1.38 eV to 1.18 eV, and an internal quantum efficiency of at least 80% at an irradiance energy from 1.38 eV to 1.30 eV;

an internal quantum efficiency of at least 70% at an irradiance energy from 1.38 eV to 1.10 eV, and an internal quantum efficiency of at least 80% at an irradiance energy from 1.38 eV to 1.18 eV;

an internal quantum efficiency of at least 70% at an irradiance energy from 1.38 eV to 1.03 eV, and an internal quantum efficiency of at least 80% at an irradiance energy from 1.38 eV to 1.13 eV; or an internal quantum efficiency of at least 60% at an irradiance energy from 1.38 eV to 0.92 eV, an internal quantum efficiency of at least 70% at an irradiance energy from 1.38 eV to 1.03 eV, and an internal quantum efficiency of at least 80% at an irradiance energy from 1.38 eV to 1.08 eV; wherein the internal quantum efficiency is measured at a junction temperature of 25° C.

$Ga_{1-x}In_xN_yAs_{1-y-z}Sb_z$ subcells having a band gap between 1.18 eV and 1.24 eV, exhibited an internal quantum efficiency of at least 70% at an irradiance energy from 1.38 eV to 1.27 eV, and an internal quantum efficiency of at least 80% at an irradiance energy from 1.38 eV to 1.30 eV, measured at a junction temperature of 25° C.

$Ga_{1-x}In_xN_yAs_{1-y-z}Sb_z$ subcells having a band gap between 1.10 eV and 1.14 eV, exhibited an internal quantum efficiency of at least 70% at an irradiance energy from 1.38 eV to 1.18 eV, and an internal quantum efficiency of at least 80% at an irradiance energy from 1.38 eV to 1.30 eV, measured at a junction temperature of 25° C.

$Ga_{1-x}In_xN_yAs_{1-y-z}Sb_z$ subcells having a band gap between 1.04 eV and 1.06 eV, exhibited an internal quantum efficiency of at least 70% at an irradiance energy from 1.38 eV to 1.10 eV, and an internal quantum efficiency of at least 80% at an irradiance energy from 1.38 eV to 1.18 eV, measured at a junction temperature of 25° C.

$Ga_{1-x}In_xN_yAs_{1-y-z}Sb_z$ subcells having a band gap between 0.94 eV and 0.98 eV, exhibited an internal quantum efficiency of at least 70% at an irradiance energy from 1.38 eV to 1.03 eV, and an internal quantum efficiency of at least 80% at an irradiance energy from 1.38 eV to 1.13 eV, measured at a junction temperature of 25° C.

$Ga_{1-x}In_xN_yAs_{1-y-z}Sb_z$ subcells having a band gap between 0.80 eV and 0.90 eV, exhibited an internal quantum efficiency of at least 60% at an irradiance energy from 1.38 eV to 0.92 eV, an internal quantum efficiency of at least 70% at an irradiance energy from 1.38 eV to 1.03 eV, and an internal quantum efficiency of at least 80% at an irradiance energy from 1.38 eV to 1.08 eV, measured at a junction temperature of 25° C.

The $Ga_{1-x}In_xN_yAs_{1-y-z}Sb_z$ subcells exhibited an Eg/q-Voc of at least 0.55 V, at least 0.60 V, or at least 0.65 V over each respective range of irradiance energies listed in the preceding paragraph. The $Ga_{1-x}In_xN_yAs_{1-y-z}Sb_z$ subcells exhibited an Eg/q-Voc within the range of 0.55 V to 0.70 V over each respective range of irradiance energies listed in the preceding paragraphs.

A $Ga_{1-x}In_xN_yAs_{1-y-z}Sb_z$ subcell can be characterized by a band gap of about 1.24 eV, an internal quantum efficiency greater than 70% at irradiance energies from about 1.27 eV to about 1.38 eV and an internal quantum efficiency greater than 80% at irradiance energies from about 1.33 eV to about 1.38 eV.

A $Ga_{1-x}In_xN_yAs_{1-y-z}Sb_z$ subcell can be characterized by a band gap of about 1.14 eV, an internal quantum efficiency greater than 70% at irradiance energies from about 1.24 eV to about 1.38 eV and an internal quantum efficiency greater than 80% at irradiance energies from about 1.30 eV to about 1.38 eV.

A $Ga_{1-x}In_xN_yAs_{1-y-z}Sb_z$ subcell can be characterized by a band gap of about 1.10 eV, an internal quantum efficiency greater than 70% at irradiance energies from about 1.18 eV to about 1.38 eV and an internal quantum efficiency greater than 80% at irradiance energies from about 1.30 eV to about 1.38 eV.

A $Ga_{1-x}In_xN_yAs_{1-y-z}Sb_z$ subcell can be characterized by a band gap of about 1.05 eV, an internal quantum efficiency greater than 70% at irradiance energies from about 1.13 eV to about 1.38 eV and an internal quantum efficiency greater than 80% at irradiance energies from about 1.18 eV to about 1.38 eV.

A $Ga_{1-x}In_xN_yAs_{1-y-z}Sb_z$ subcell can be characterized by a band gap of about 1.00 eV, an internal quantum efficiency greater than 70% at irradiance energies from about 1.08 eV to about 1.38 eV and an internal quantum efficiency greater than 80% at irradiance energies from about 1.13 eV to about 1.38 eV.

A $Ga_{1-x}In_xN_yAs_{1-y-z}Sb_z$ subcell can be characterized by a band gap of about 0.96 eV, an internal quantum efficiency greater than 70% at irradiance energies from about 1.03 eV to about 1.38 eV and an internal quantum efficiency greater than 80% at irradiance energies from about 1.13 eV to about 1.38 eV.

A $Ga_{1-x}In_xN_yAs_{1-y-z}Sb_z$ subcell can be characterized by a band gap of about 0.82 eV, an internal quantum efficiency greater than 70% at irradiance energies from about 0.99 eV to about 1.38 eV and an internal quantum efficiency greater than 80% at irradiance energies from about 1.13 eV to about 1.38 eV.

The quality of a $Ga_{1-x}In_xN_yAs_{1-y-z}Sb_z$ subcell is reflected in a high short circuit current density Jsc, a low open circuit voltage Voc, a high fill factor, and a high internal quantum efficiency over a broad range of irradiance wavelengths/energies.

These parameters are provided for certain $Ga_{1-x}In_xN_yAs_{1-y-z}Sb_z$ subcells having a band gap from 0.907 eV to 1.153 eV in Table 2.

TABLE 2

Properties of certain $Ga_{1-x}In_xN_yAs_{1-y-z}Sb_z$ subcells.

| | $Ga_{1-x}In_xN_yAs_{1-y-z}Sb_z$ Mole Fraction | | | Jsc | Voc | Eg/q-Voc | FF | PL BG | Base thickness |
|---|---|---|---|---|---|---|---|---|---|
| Subcell | In(x) | N(y) | Sb(z) | (mA·cm²) | (V) | (V) | (%) | (eV) | (μm) |
| A | 6.8-7.8 | 1.0-1.7 | 0.4-0.8 | 9.72 | 0.53 | 0.623 | 0.75 | 1.153 | 2 |
| B | 7.9 | 1.7 | 0.7-0.8 | 9.6 | 0.48 | 0.633 | 0.74 | 1.113 | 2 |
| C | 7.8 | 1.82 | 0.4-0.8 | 9.8 | 0.46 | 0.655 | 0.73 | 1.115 | 2 |
| D | 17-18 | 4.3-4.8 | 1.2-1.6 | 15.2 | 0.315 | 0.592 | 0.62 | 0.907 | 2 |

In Table 2, FF refers to the fill factor and PL BG refers to the band gap as measured using photoluminescence.

Figure 4A:
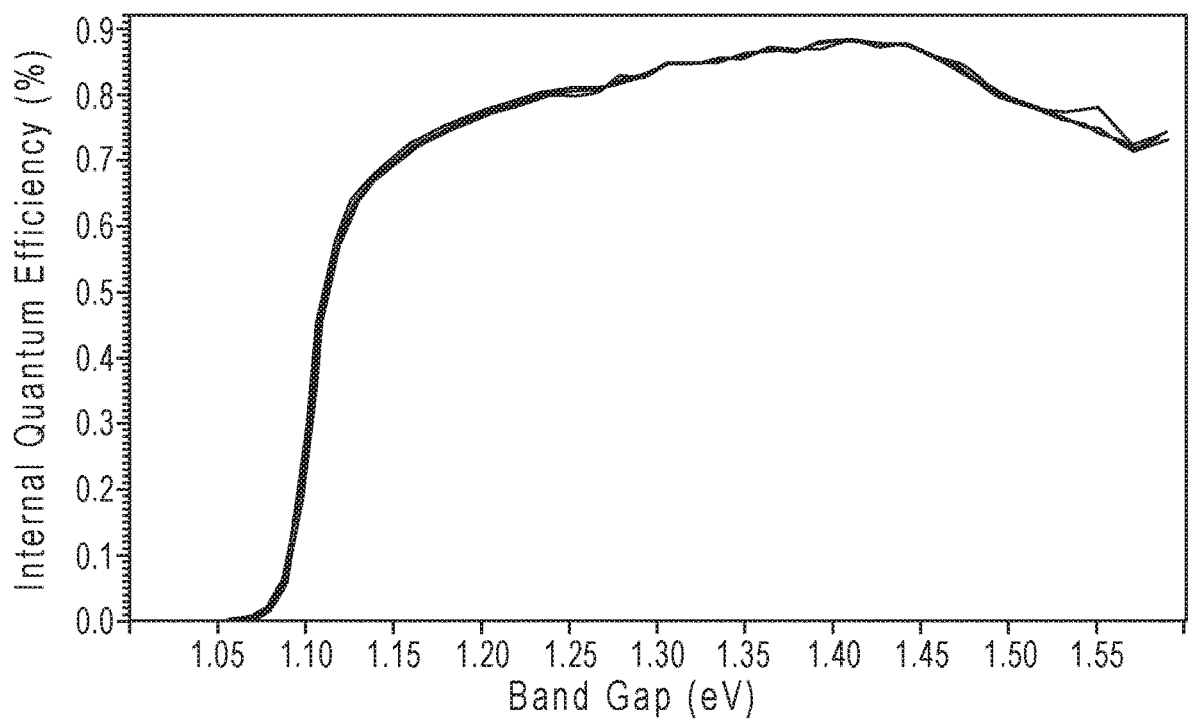
FIG. 4A shows the internal quantum efficiency as a function of irradiance energy for a $Ga_{1-x}In_xN_yAs_{1-y-z}Sb_z$ subcell having a band gap of 1.113 eV, where x is 7.9, y is 1.7, and z is from 0.7 to 0.8.
Figure 4B:
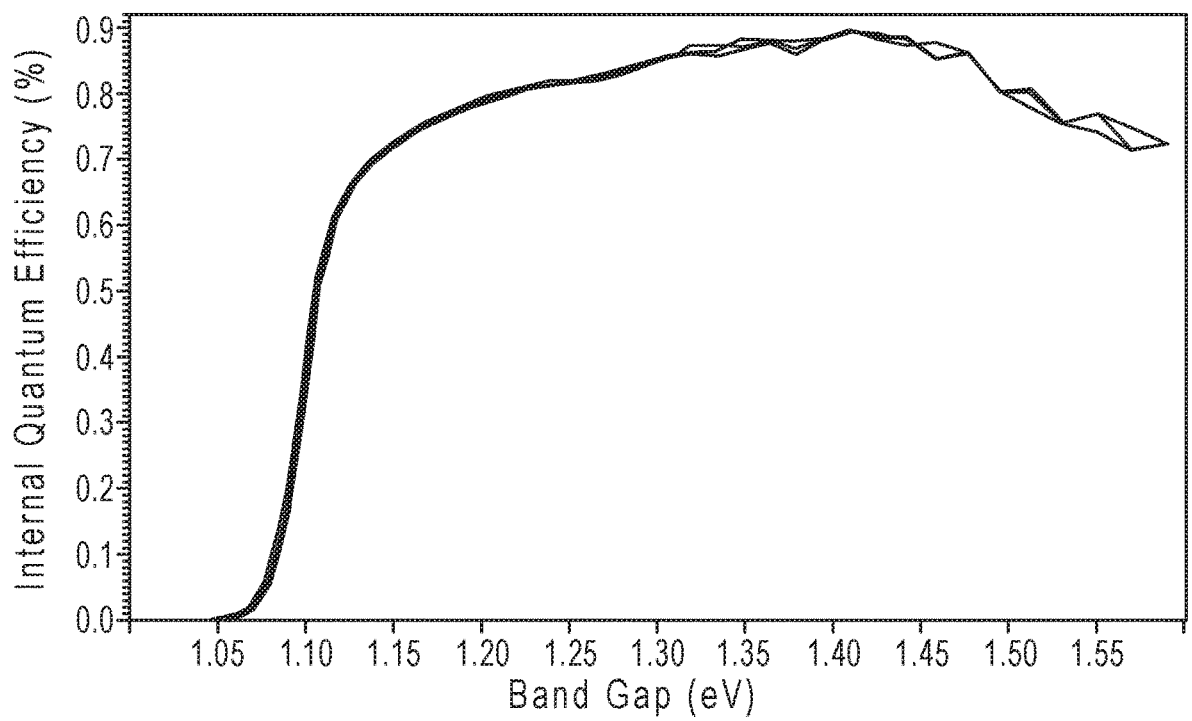
FIG. 4B shows the internal quantum efficiency as a function of irradiance energy for a $Ga_{1-x}In_xN_yAs_{1-y-z}Sb_z$ subcell having a band gap of 1.115 eV, where x is 7.8, y is 1.82, and z is from 0.4 to 0.8.
Figure 4C:
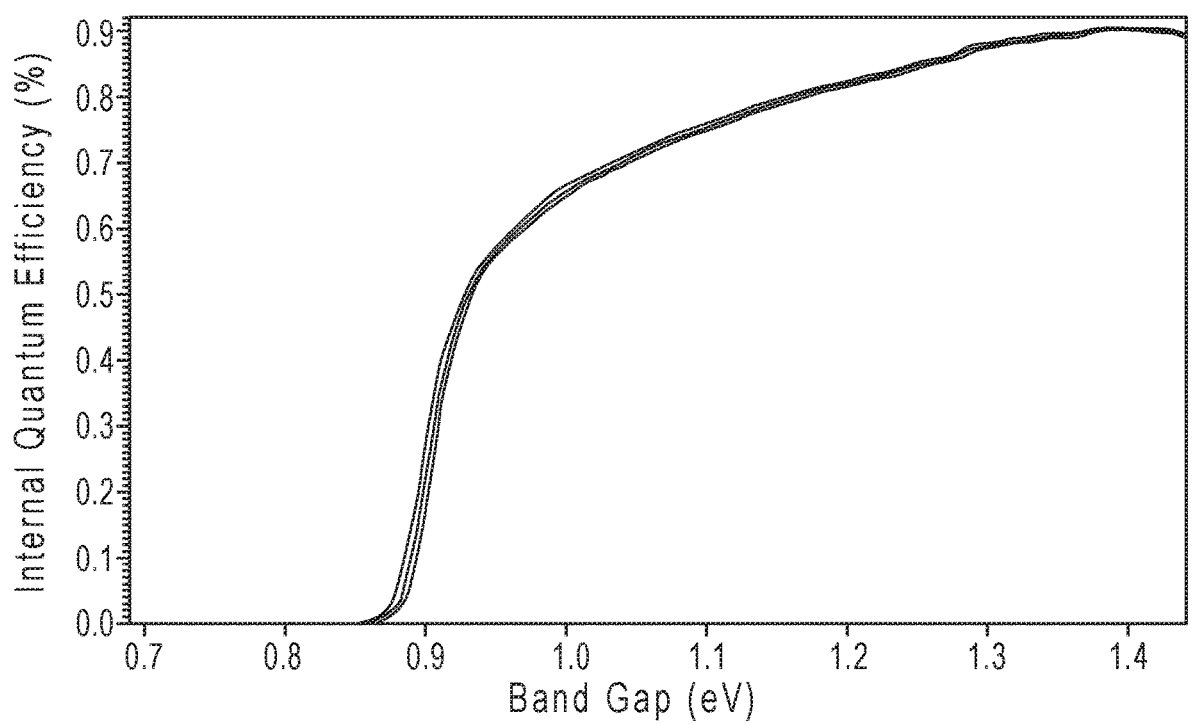
FIG. 4C shows the internal quantum efficiency as a function of irradiance energy for a $Ga_{1-x}In_xN_yAs_{1-y-z}Sb_z$ subcell having a band gap of 0.907 eV, where x is from 17 to 18, y is from 4.3 to 4.8, and z is from 1.2 to 1.6.

For each of the $Ga_{1-x}In_xN_yAs_{1-y-z}Sb_z$ subcells presented in Table 2, the external quantum efficiency (EQE) was about 87% and the internal quantum efficiency (IQE) was about 89% at a junction temperature of 25° C. The dependence of the internal quantum efficiencies as a function of irradiance energy for subcells B, C, and D. $Ga_{1-x}In_xN_yAs_{1-y-z}Sb_z$ subcells are shown in FIGS. 4A, 4B, and 4C, respectively. The internal quantum efficiencies are greater than about 70% at irradiance energies from about 1.15 eV to about 1.55 eV (1078 nm to 800 nm).

The internal quantum efficiencies for $Ga_{1-x}In_xN_yAs_{1-y-z}Sb_z$ subcells B, C, and D are presented in graphical form in FIGS. 4A, 4B, and 4C and are summarized in Table 3.

TABLE 3

Composition and internal quantum efficiencies of $Ga_{1-x}In_xN_yAs_{1-y-z}Sb_z$ subcells as a function of irradiance energy.

| $Ga_{1-x}In_xN_yAs_{1-y-z}Sb_z$ | | | Band Gap | Internal Quantum Efficiency (%) at Irradiance Energy (eV) | | | | | | |
|---|---|---|---|---|---|---|---|---|---|---|
| Mole Fraction | | | (eV) | 0.95 | 1.05 | 1.15 | 1.25 | 1.35 | 1.45 | 1.55 |
| Subcell | In(x) | N(y) | Sb(z) | — | eV | eV | eV | eV | eV | eV | eV |
| B | 7.9 | 1.7 | 0.7-0.8 | 1.113 | — | — | 70 | 80 | 85 | 85 | 77 |
| C | 7.8 | 1.82 | 0.4-0.8 | 1.115 | — | — | 72 | 82 | 87 | 86 | 77 |
| D | 17-18 | 4.3-4.8 | 1.2-1.6 | 0.907 | 57 | 73 | 81 | 87 | 92 | 92 | — |

As shown in FIGS. 4A, 4B, and 4C, and in Table 3, $Ga_{1-x}In_xN_yAs_{1-y-z}Sb_z$ subcells having a band gap of about 1.11 eV exhibit an IQE greater than 70% over a range of irradiance energies from about 1.15 eV to at least 1.55 eV, and an IQE greater than 80% over a range of irradiance energies from about 1.25 eV to about 1.45 eV.

Also, as shown in FIGS. 4A, 4B, and 4C, and in Table 3, $Ga_{1-x}In_xN_yAs_{1-y-z}Sb_z$ subcells having a band gap of about 0.91 eV exhibit an IQE greater than 70% over a range of irradiance energies from about 1.05 eV to at least 1.45 eV, and an IQE greater than 80% over a range of irradiance energies from about 1.15 eV to at least 1.45 eV.

Figure 5:
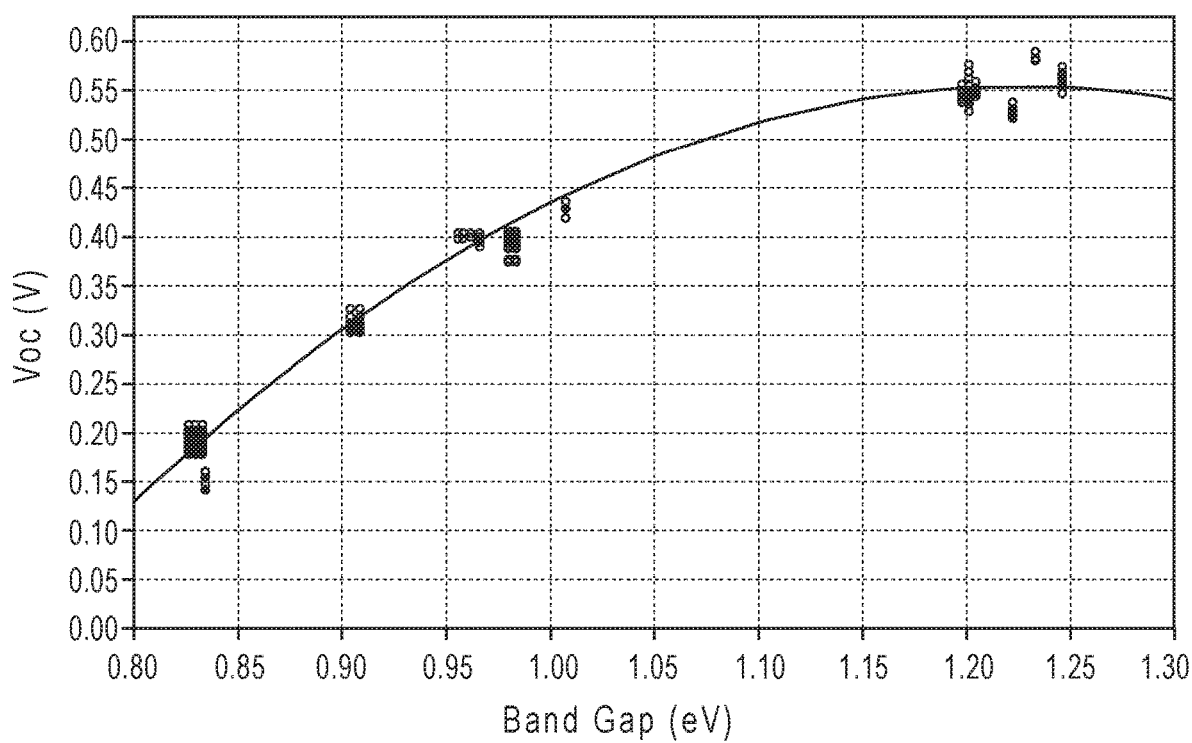
FIG. 5 shows the open circuit voltage Voc for GaInNAsSb subcells having different band gaps.

The quality of the $Ga_{1-x}In_xN_yAs_{1-y-z}Sb_z$ compositions provided by the present disclosure is also reflected in the low open circuit voltage Voc, which depends in part on the band gap of the $Ga_{1-x}In_xN_yAs_{1-y-z}Sb_z$ composition. The dependence of the open circuit voltage Voc with the band gap of the $Ga_{1-x}In_xN_yAs_{1-y-z}Sb_z$ composition is shown in FIG. 5. As shown in FIG. 5, the open circuit voltage Voc changes from about 0.2 V for a $Ga_{1-x}In_xN_yAs_{1-y-z}Sb_z$ composition with a band gap of about 0.85 eV, to an open circuit voltage Voc of about 0.5 V for a $Ga_{1-x}In_xN_yAs_{1-y-z}Sb_z$ composition with a band gap of about 1.2 eV.

$Ga_{1-x}In_xN_yAs_{1-y-z}Sb_z$ subcells exhibiting a band gap from 0.90 eV to 1.2 eV can have values for x, y, and z of $0.010 \leq x \leq 0.18$, $0.015 \leq y \leq 0.083$, $0.004 \leq z \leq 0.018$. A summary of the element content, band gap, short circuit current density Jsc and open circuit voltage Voc for certain $Ga_{1-x}In_xN_yAs_{1-y-z}Sb_z$ subcells is presented in Table 4.

TABLE 4

Composition and properties of $Ga_{1-x}In_xN_yAs_{1-y-z}Sb_z$ subcells.

| | In (x) | N (y) | Sb (z) | Band Gap (eV) | Jsc (mA/cm²) | Voc (V) |
|---|---|---|---|---|---|---|
| D | 0.17-0.18 | 0.043-0.048 | 0.012-0.016 | 0.907 | 15.2 | 0.315 |
| E | 0.12-0.14 | 0.030-0.035 | 0.007-0.014 | 0.96-0.97 | — | — |
| F | 0.13 | 0.032 | 0.007-0.014 | 0.973 | — | — |
| B | 0.079 | 0.017 | 0.007-0.008 | 1.113 | 9.6 | 0.48 |
| C | 0.078 | 0.0182 | 0.004-0.008 | 1.115 | 9.8 | 0.46 |
| G | 0.083 | 0.018 | 0.013 | 1.12 | 9.7 | 0.49 |
| H | 0.079 | 0.022 | 0.013 | 1.12 | 13.12 | 0.63 |
| A | 0.068-0.078 | 0.010-0.017 | 0.004-0.008 | 1.153-1.157 | 9.72 | 0.53 |
| I | 0.05 | 0.013 | 0.018 | 1.16 | 6.57 | 0.54 |
| J | 0.035 | 0.014 | 0.018 | 1.2 | 6.32 | 0.55 |
| K | 0.028 | 0.016 | 0.007 | 1.2 | — | — |

In Table 3, the short circuit current density Jsc and open circuit voltage Voc were measured using a 1 sun AM1.5D spectrum at a junction temperature of 25° C. The $Ga_{1-x}In_xN_yAs_{1-y-z}Sb_z$ subcells were 2 μm thick.

In certain embodiments, a $Ga_{1-x}In_xN_yAs_{1-y-z}Sb_z$ subcell can be characterized by a Eg/q-Voc equal to or greater than 0.55 V measured using a 1 sun AM1.5D spectrum at a junction temperature of 25° C.

In certain embodiments, a $Ga_{1-x}In_xN_yAs_{1-y-z}Sb_z$ subcell can be characterized by a Eg/q-Voc from 0.4 V to 0.7 V measured using a 1 sun AM1.5D spectrum at a junction temperature of 25° C.

In certain embodiments, a $Ga_{1-x}In_xN_yAs_{1-y-z}Sb_z$ subcell can have values for x, y, and z of $0.016 \le x \le 0.19$, $0.040 \le y \le 0.051$, and $0.010 \le z \le 0.018$;

a band gap from 0.89 eV to 0.92 eV;

a short circuit current density Jsc greater than 15 mA/cm²; and an open circuit voltage Voc greater than 0.3 V.

In certain embodiments, a $Ga_{1-x}In_xN_yAs_{1-y-z}Sb_z$ subcell can have values for x, y, and z of $0.010 \le x \le 0.16$, $0.028 \le y \le 0.037$, and $0.005 \le z \le 0.016$; and a band gap from 0.95 eV to 0.98 eV.

In certain embodiments, a $Ga_{1-x}In_xN_yAs_{1-y-z}Sb_z$ subcell can have values for x, y, and z of $0.075 \le x \le 0.081$, $0.040 \le y \le 0.051$, and $0.010 \le z \le 0.018$;

a band gap from 1.111 eV to 1.117 eV;

a short circuit current density Jsc greater than 9 mA/cm²; and an open circuit voltage Voc greater than 0.4 V.

In certain embodiments, a $Ga_{1-x}In_xN_yAs_{1-y-z}Sb_z$ subcell can have values for x, y, and z of $0.016 \le x \le 0.024$, $0.077 \le y \le 0.085$, and $0.011 \le z \le 0.015$;

a band gap from 1.10 eV to 1.14 eV;

a short circuit current density Jsc greater than 9 mA/cm²; and an open circuit voltage Voc greater than 0.4 V.

In certain embodiments, a $Ga_{1-x}In_xN_yAs_{1-y-z}Sb_z$ subcell can have values for x, y, and z of $0.068 \le x \le 0.078$, $0.010 \le y \le 0.017$, and $0.011 \le z \le 0.004$ x<0.008;

a band gap from 1.15 eV to 1.16 eV;

a short circuit current density Jsc greater than 9 mA/cm²; and an open circuit voltage Voc greater than 0.5 V.

In certain embodiments, a $Ga_{1-x}In_xN_yAs_{1-y-z}Sb_z$ subcell can have values for x, y, and z of $0.011 \le x \le 0.015$, $0.04 \le y \le 0.06$, and $0.016 \le z \le 0.020$;

a band gap from 1.14 eV to 1.18 eV;

a short circuit current density Jsc greater than 6 mA/cm²; and an open circuit voltage Voc greater than 0.5 V.

In certain embodiments, a $Ga_{1-x}In_xN_yAs_{1-y-z}Sb_z$ subcell can have values for x, y, and z of $0.012 \le x \le 0.016$, $0.033 \le y \le 0.037$, and $0.016 \le z \le 0.020$;

a band gap from 1.18 eV to 1.22 eV;

a short circuit current density Jsc greater than 6 mA/cm²; and an open circuit voltage Voc greater than 0.5 V.

In certain embodiments, a $Ga_{1-x}In_xN_yAs_{1-y-z}Sb_z$ subcell can have values for x, y, and z of $0.026 \le x \le 0.030$, $0.024 \le y \le 0.018$, and $0.005 \le z \le 0.009$;

a band gap from 1.18 eV to 1.22 eV.

In certain embodiments, a $Ga_{1-x}In_xN_yAs_{1-y-z}Sb_z$ subcell can have values for x, y, and z wherein $0.075 \le x \le 0.082$, $0.016 \le y \le 0.019$, and $0.004 \le z \le 0.010$, and the subcell can be characterized by, a band gap from 1.12 eV to 1.16 eV;

a short circuit current density Jsc of at least 9.5 mA/cm²; and an open circuit voltage Voc of at least 0.40 V, wherein the Jsc and the Voc are measured using a 1 sun AM1.5D spectrum at a junction temperature of 25° C.

In certain embodiments, a $Ga_{1-x}In_xN_yAs_{1-y-z}Sb_z$ subcell can have values for x, y, and z wherein $0.011 \le x \le 0.016$, $0.02 \le y \le 0.065$, and $0.016 \le z \le 0.020$, and the subcell can be characterized by, a band gap from 1.14 eV to 1.22 eV;

a short circuit current density Jsc of at least 6 mA/cm²; and an open circuit voltage Voc of at least 0.50 V, wherein the Jsc and the Voc are measured using a 1 sun AM1.5D spectrum at a junction temperature of 25° C.

In certain embodiments, a $Ga_{1-x}In_xN_yAs_{1-y-z}Sb_z$ subcell can have values for x, y, and z wherein $0.016 \le x \le 0.0024$, $0.077 \le y \le 0.085$, and $0.010 \le z \le 0.016$, and the subcell can be characterized by, a band gap from 1.118 eV to 1.122 eV;

a short circuit current density Jsc of at least 9 mA/cm²; and an open circuit voltage Voc of at least 0.40 V, wherein the Jsc and the Voc are measured using a 1 sun AM1.5D spectrum at a junction temperature of 25° C.

In certain embodiments, a $Ga_{1-x}In_xN_yAs_{1-y-z}Sb_z$ subcell can be characterized by a bandgap from 0.8 eV to 1.3 eV; and values for x, y, and z of $0.03 \le x \le 0.19$, $0.008 \le y \le 0.055$, and $0.001 \le z \le 0.05$.

In certain embodiments, a $Ga_{1-x}In_xN_yAs_{1-y-z}Sb_z$ subcell can have $0.06 \le x \le 0.09$, $0.01 \le y \le 0.025$, and $0.004 \le z \le 0.014$, and the subcell can be characterized by, a bandgap from 1.12 eV to 1.16 eV;

a short circuit current density Jsc equal to or greater than 9.5 mA/cm²; and an open circuit voltage Voc equal to or greater than 0.40 V, wherein the Jsc and the Voc are measured using a 1 sun AM1.5D spectrum at a junction temperature of 25° C.

In certain embodiments, a $Ga_{1-x}In_xN_yAs_{1-y-z}Sb_z$ subcell can have values of $0.004 \le x \le 0.08$, $0.008 \le y \le 0.02$, and $0.004 \le z \le 0.014$, and the subcell can be characterized by, a bandgap from 1.14 eV to 1.22 eV;

a short circuit current density Jsc equal to or greater than 6 mA/cm²; and an open circuit voltage Voc equal to or greater than 0.50 V, wherein the Jsc and the Voc are measured using a 1 sun AM1.5D spectrum at a junction temperature of 25° C.

In certain embodiments, a $Ga_{1-x}In_xN_yAs_{1-y-z}Sb_z$ subcell can have values of $0.06 \le x \le 0.09$, $0.01 \le y \le 0.03$, and $0.004 \le z \le 0.014$, and the subcell can be characterized by, a bandgap from 1.118 eV to 1.122 eV;

a short circuit current density Jsc equal to or greater than 9 mA/cm²; and an open circuit voltage Voc equal to or greater than 0.40 V, wherein the Jsc and the Voc are measured using a 1 sun AM1.5D spectrum at a junction temperature of 25° C.

Multijunction photovoltaic cells provided by the present disclosure can comprise at least one subcell comprising a $Ga_{1-x}In_xN_yAs_{1-y-z}Sb_z$ semiconductor material or subcell provided by the present disclosure, and wherein each of the subcells is lattice matched to each of the other subcells. Such multijunction photovoltaic cells can comprise three junctions, four junctions, five junctions, or six junctions, in which at least one of the junctions or subcells comprises a $Ga_{1-x}In_xN_yAs_{1-y-z}Sb_z$ semiconductor material provided by the present disclosure. In certain embodiments, a multijunction photovoltaic cell comprises one subcell comprising a $Ga_{1-x}In_xN_yAs_{1-y-z}Sb_z$ semiconductor material provided by the present disclosure, and in certain embodiments, two subcells comprising a $Ga_{1-x}In_xN_yAs_{1-y-z}Sb_z$ semiconductor material provided by the present disclosure. The $Ga_{1-x}In_xN_yAs_{1-y-z}Sb_z$ semiconductor material can be selected to have a suitable bandgap depending at least in part on the structure of the multijunction photovoltaic cell. The band gap of the $Ga_{1-x}In_xN_yAs_{1-y-z}Sb_z$ semiconductor material can be, for example, from about 0.80 eV to about 0.14 eV.

Figure 6A:
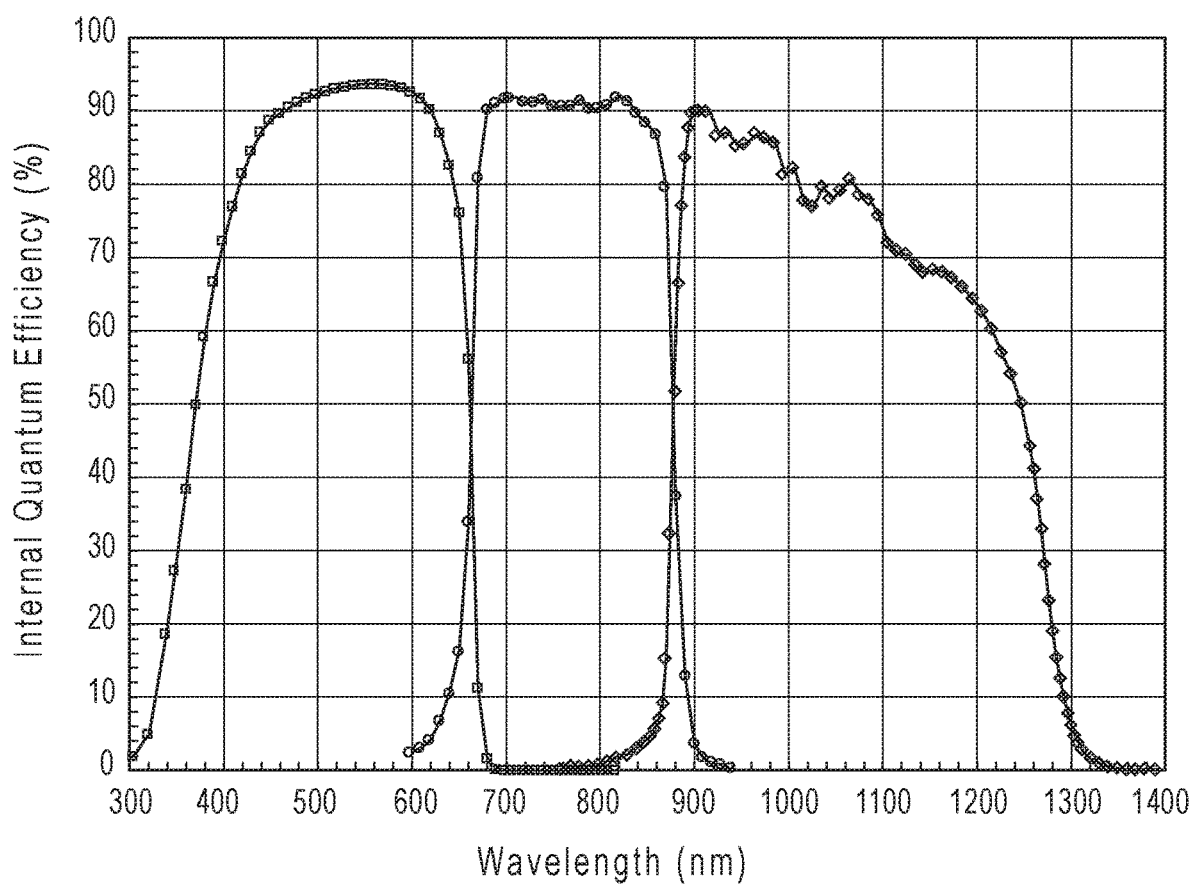
FIG. 6A shows the internal quantum efficiency as a function of irradiance wavelength for each subcell of a three junction (Al)InGaP/(Al,In)GaAs/$Ga_{1-x}In_xN_yAs_{1-y-z}Sb_z$ photovoltaic cell measured using a 1 sun AM1.5D spectrum.
Figure 6B:
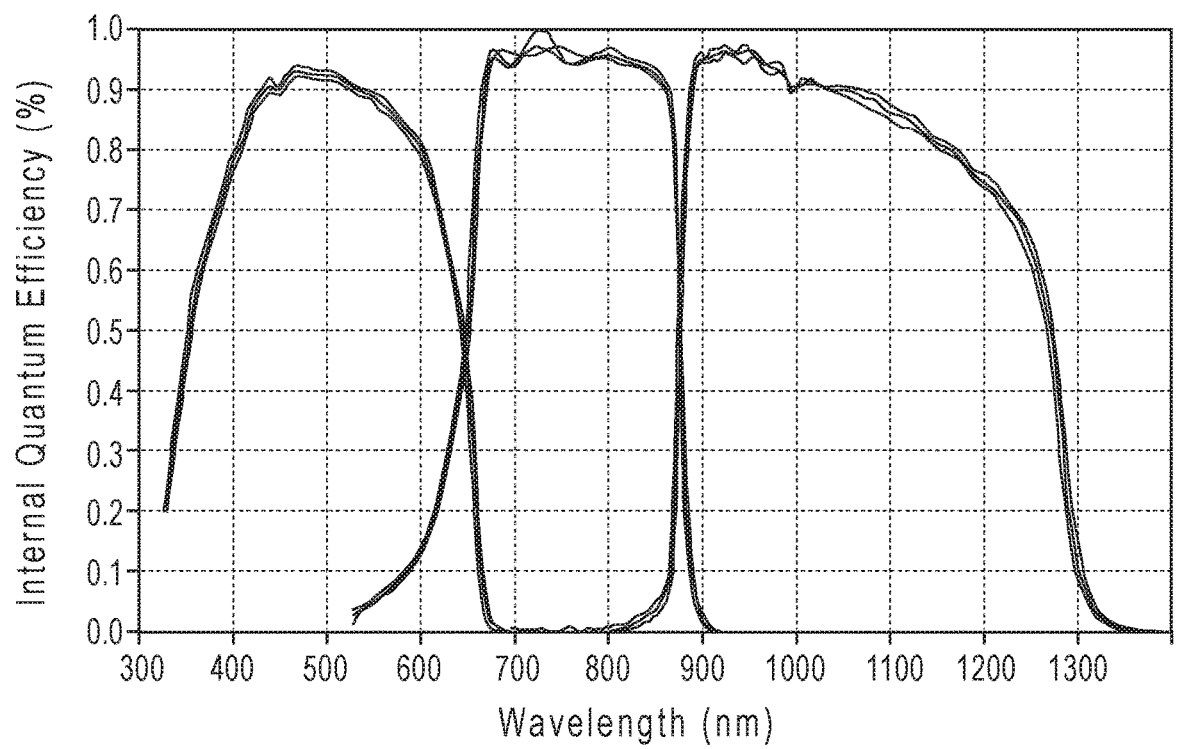
FIG. 6B shows the internal quantum efficiency as a function of irradiance wavelength for each subcell of a three junction (Al)InGaP/(Al,In)GaAs/$Ga_{1-x}In_xN_yAs_{1-y-z}Sb_z$ photovoltaic cell measured using a 1 sun AM0 spectrum.
Figure 6C:
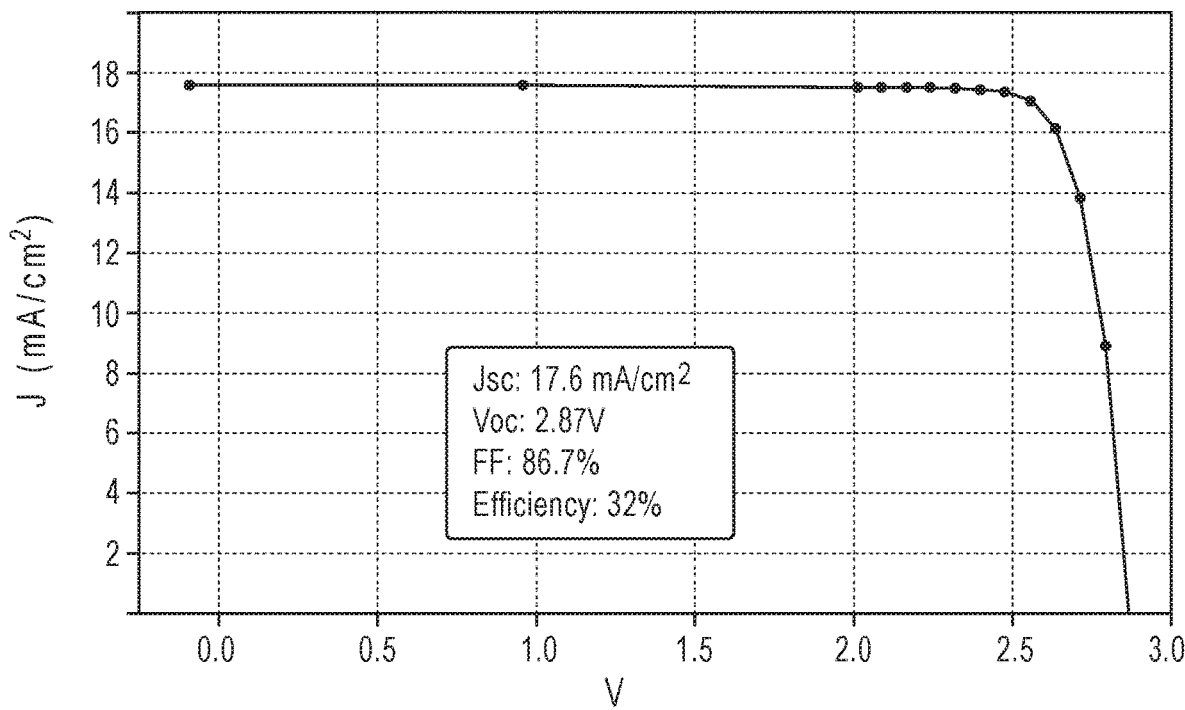
FIG. 6C shows a short circuit/voltage curve for a three junction (Al)InGaP/(Al,In)GaAs/$Ga_{1-x}In_xN_yAs_{1-y-z}Sb_z$ photovoltaic cell measured using a 1 sun AM0 spectrum

Three junction photovoltaic cells having a bottom $Ga_{1-x}In_xN_yAs_{1-y-z}Sb_z$ subcell (J3), a second (Al,In)GaAs subcell (J2), and atop InGaP or AlInGaP subcell (J1) were fabricated. Each of the subcells is lattice matched to (Al,In)GaAs. Therefore, each of the subcells is lattice matched to each of the other subcells The parameters for the three junction photovoltaic cells measured using a 1 sun (1366 W/m²) AM0 spectrum at 25° C. are provided in Table 5. The internal quantum efficiencies for each of the subcells is shown in FIG. 6A.

TABLE 5

Properties of three-junction $Ga_{1-x}In_xN_yAs_{1-y-z}Sb_z$-containing photovoltaic cells.

| | (Al)InGaP/(Al,In)GaAs/GaInNAsSb |
|---|---|
| Voc (V) | 2.87 |
| Jsc (mA/cm²) | 17.6 |
| FF (%) | 86.7 |
| Efficiency (%) | 32 |
| J1 band gap (eV); (Al)InGaP | 1.9 |
| J2 band gap (eV); (Al,In)GaAs | 1.42 |
| J3 band gap (eV); GaInNAsSb | 0.96 |

The three junction photovoltaic cells using a bottom $Ga_{1-x}In_xN_yAs_{1-y-z}Sb_z$ subcell (J3) exhibit a high Voc of about 2.9 V, a high Jsc of about 16 mA/cm², a high fill factor of about 85%, and a high efficiency of around 30%, illuminated with an AM0 spectrum. (Al)InGaP/(Al,In)GaAs/GaInNAsSb photovoltaic cells are characterized by an open circuit voltage Voc of at least 2.8 V, a short circuit current density of at least 17 mA, a fill factor of at least 80%, and an efficiency of at least 28%, measured using a 1 sun AM0 spectrum at a junction temperature of 25°.

(Al)InGaP/(Al,In)GaAs/GaInNAsSb photovoltaic cells are characterized by an open circuit voltage Voc from 2.8 V to 2.9 V, a short circuit current density from 16 mA/cm² to 18 mA/cm², a fill factor from 80% to 90% and an efficiency from 28% to 34%, illuminated with an AM0 spectrum.

(Al)InGaP/(Al,In)GaAs/GaInNAsSb photovoltaic cells are characterized by an open circuit voltage Voc from 2.85 V to 2.95 V, a short circuit current density from 15 mA/cm² to 17 mA/cm², a fill factor from 80% to 89% and an efficiency from 25% to 35%, measured using a 1 sun AM0 spectrum at a junction temperature of 25° C.

In certain embodiments, a three junction multijunction photovoltaic cell can comprise:

a $Ga_{1-x}In_xN_yAs_{1-y-z}Sb_z$ subcell characterized by a bandgap from 0.9 eV to 1.1 eV;

an (Al,In)GaAs subcell overlying the $Ga_{1-x}In_xN_yAs_{1-y-z}Sb_z$ subcell, wherein the (Al,In)GaAs subcell is characterized by a bandgap from 1.3 eV to 1.5 eV; and an (Al)InGaP subcell overlying the (Al,In)GaAs subcell, wherein the (Al)InGaP subcell is characterized by a bandgap from 1.8 eV to 2.10 eV; wherein, each of the subcells is lattice matched to each of the other subcells; and the multijunction photovoltaic cell can be characterized by, an open circuit voltage Voc equal to or greater than 2.5 V;

a short circuit current density Jsc equal to or greater than 12 mA/cm²;

a fill factor equal to or greater than 75%; and an efficiency of at least 28%, measured using a 1 sun AM1.5D or AM0 spectrum at a junction temperature of 25° C.

In certain embodiments, a three junction multijunction photovoltaic cell can be characterized by, an open circuit voltage Voc from 2.5 V to 3.2 V;

a short circuit current density Jsc from 15 mA/cm² to 17.9 mA/cm²;

a fill factor from 80% to 90%; and an efficiency from 28% to 33%, measured using a 1 sun AM0 spectrum at a junction temperature of 25° C.

In certain embodiments, a three junction multijunction photovoltaic cell can be characterized by, an open circuit voltage Voc from 2.55 V to 2.85 V;

a short circuit current density Jsc from 13.0 mA/cm² to 15 mA/cm²;

a fill factor from 75% to 87%; and an efficiency from 28% to 35%, measured using a 1 sun AM1.5 D spectrum at a junction temperature of 25° C.

In certain embodiments, a multijunction photovoltaic cell can comprise:

a $Ga_{1-x}In_xN_yAs_{1-y-z}Sb_z$ subcell characterized by a bandgap from 0.9 eV to 1.05 eV;

a (Al,In)GaAs subcell overlying the $Ga_{1-x}In_xN_yAs_{1-y-z}Sb_z$ subcell, wherein the (Al,In)GaAs subcell is characterized by a bandgap from 1.3 eV to 1.5 eV; and an (Al)InGaP subcell overlying the (Al,In)GaAs subcell, wherein the (Al)InGaP subcell is characterized by a bandgap from 1.85 eV to 2.05 eV; wherein, each of the subcells is lattice matched to each of the other subcells; and the multijunction photovoltaic cell can be characterized by, an open circuit voltage Voc equal to or greater than 2.5 V;

a short circuit current density Jsc equal to or greater than 15 mA/cm²;

a fill factor equal to or greater than 80%; and an efficiency equal to or greater than 28%, measured using a 1 sun AM1.5D spectrum at a junction temperature of 25° C.

In certain embodiments, a three junction multijunction photovoltaic cell can be characterized by, an open circuit voltage Voc from 2.6 V to 3.2 V;
a short circuit current density Jsc from 15.5 mA/cm² to 16.9 mA/cm²;
a fill factor from 81% to 91%; and
an efficiency from 28% to 32%,
measured using a 1 sun AM0 spectrum at a junction temperature of 25° C.

In certain embodiments a four junction photovoltaic cell can have the general structure as shown in FIG. 2A, having a bottom Ge subcell (J4), an overlying GaInNAsSb subcell (J3), an overlying (Al,In)GaAs subcell (J2), and a top (Al)InGaP subcell (J1). Each of the subcells is substantially lattice matched to each of the other subcells and to the Ge subcell. The multijunction photovoltaic cells do not comprise a metamorphic buffer layer between adjacent subcells. The composition of each of the $Ga_{1-x}In_xN_yAs_{1-y-z}Sb_z$ subcell, the (Al,In)GaAs subcell and the (Al)InGaP subcell is selected to provide lattice matching to the (Si,Sn)Ge subcell and to provide an appropriate band gap.

In certain four junction photovoltaic cells, the $Ga_{1-x}In_xN_yAs_{1-y-z}Sb_z$ subcell (J3) can have a band gap from 0.98 eV to 1.22 eV, from 0.98 eV to 1.20 eV, from 0.98 eV, to 0.18 eV, from) 0.98 eV to 0.16 eV, from 0.98 eV to 0.14 eV, from 0.98 eV to 1.12 eV, from 0.99 eV to 1.11 eV, or from 01.00 eV to 1.10 eV. The $Ga_{1-x}In_xN_yAs_{1-y-z}Sb_z$ can be selected to substantially match the lattice constant of the (Si,Sn)Ge subcell and to provide a suitable band gap within a range, for example, from 0.98 eV to 1.12 eV.

In certain embodiments of a four junction photovoltaic cell, the $Ga_{1-x}In_xN_yAs_{1-y-z}Sb_z$ subcell (J3) can have values for x, y, and z in which $0.075 \leq x \leq 0.083$, $0.015 \leq y \leq 0.020$, and $0.003 \leq z \leq 0.009$.

In certain embodiments of a four junction photovoltaic cell, the $Ga_{1-x}In_xN_yAs_{1-y-z}Sb_z$ subcell (J3) can have values for x, y, and z in which $0.077 \leq x \leq 0.081$, $0.0165 \leq y \leq 0.0185$, and $0.004 \leq z \leq 0.009$.

In certain embodiments of a four junction photovoltaic cell, the $Ga_{1-x}In_xN_yAs_{1-y-z}Sb_z$ subcell (J3) can have values for x, y, and z in which $0.078 \leq x \leq 0.080$, $0.017 \leq y \leq 0.018$, and $0.004 \leq x \leq 0.008$.

In certain four junction photovoltaic cells the (Al,In)GaAs subcell (J2) can have a band gap from 1.4 eV to 1.53 eV, from 1.42 eV to 1.51 eV, from 1.44 eV to 1.49 eV, or from 1.46 eV to 1.48 eV.

The (Al,In)GaAs composition can be selected to match the lattice constant of the (Si,Sn)Ge subcell and to provide a suitable band gap with a range, for example, from 1.4 eV to 1.53 eV.

In certain four junction photovoltaic cells the (Al)InGaP subcell (J1) can have a band gap from 1.96 eV to 2.04 eV, from 1.97 eV to 2.03 eV, from 1.98 eV to 2.02 eV, or from 1.99 eV to 2.01 eV. The (Al)InGaP composition is selected to match the lattice constant of the Ge subcell and to provide a suitable band gap within the range, for example, from 1.96 eV to 2.04 eV.

The composition of each of the subcells is selected to have an internal quantum efficiency of at least 70% or at least 80% over a certain range of irradiance wavelengths or energies.

For example, a Ge subcell can exhibit an internal quantum efficiency greater than 85% at irradiance energies from about 0.77 eV to about 1.03 eV (about 1600 nm to 1200 nm), a $Ga_{1-x}In_xN_yAs_{1-y-z}Sb_z$ subcell can exhibit an internal quantum efficiency greater than 85% at irradiance energies from 1.13 eV to 1.38 eV (1100 nm to 900 nm), a (Al,In)GaAs subcell can exhibit an internal quantum efficiency greater than 90% at irradiance energies from 1.51 eV to 2.00 eV (820 nm to 620 nm), and a (Al)InGaP subcell can exhibit an internal quantum efficiency greater than 90% at irradiance energies from 2.07 eV to 3.10 (600 nm to 400 nm).

Figure 7A:
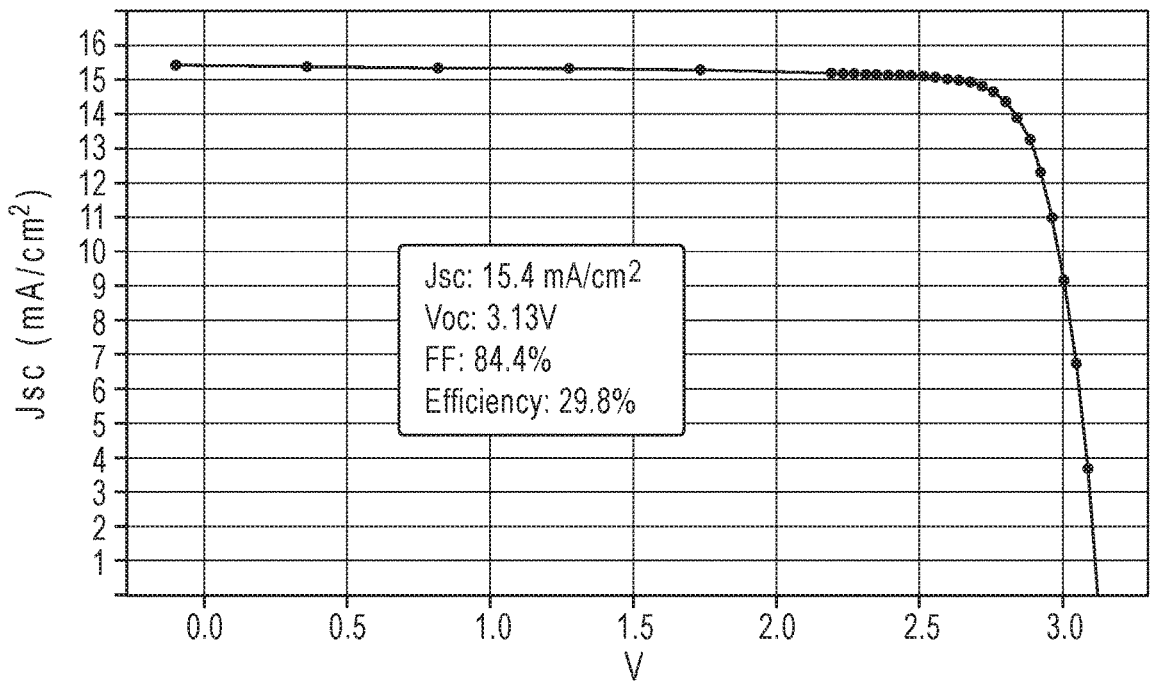
FIG. 7A shows a short circuit/voltage curve for a four-junction (Al)InGaP/(Al,In)GaAs/$Ga_{1-x}In_xN_yAs_{1-y-z}Sb_z$ photovoltaic cell.
Figure 7B:
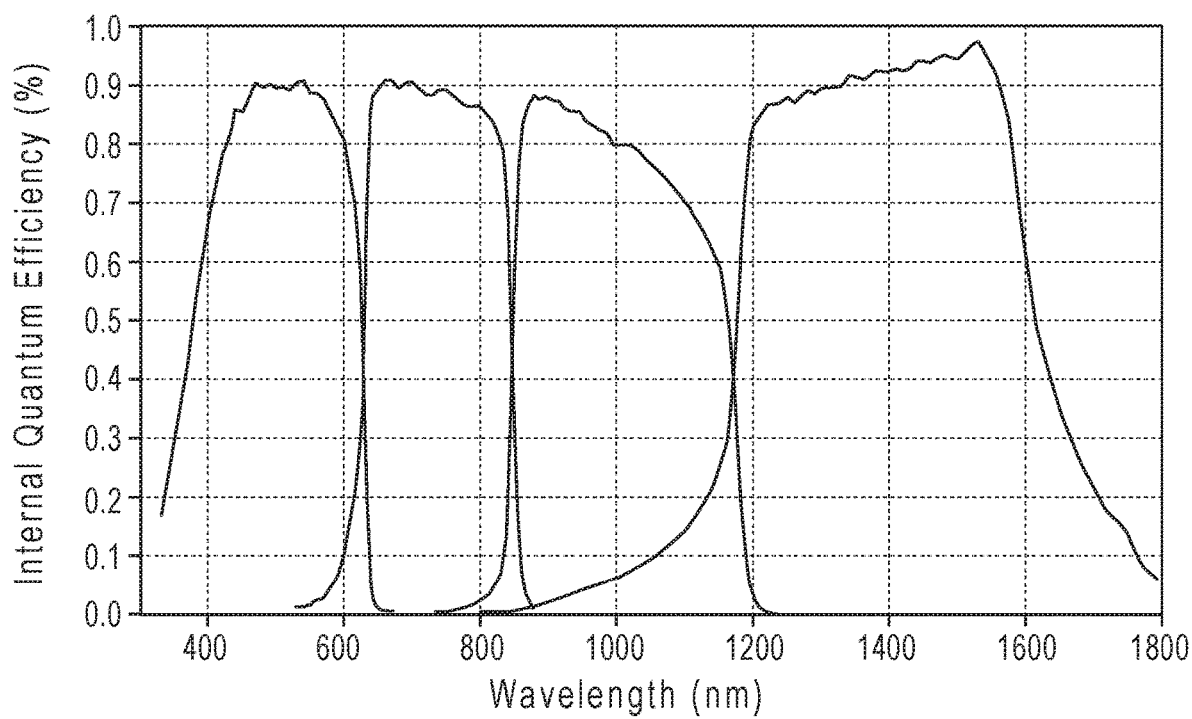
FIG. 7B shows the internal quantum efficiency as a function of irradiance wavelength for each subcell of the four-junction (Al)InGaP/(Al,In)GaAs/$Ga_{1-x}In_xN_yAs_{1-y-z}Sb_z$/Ge photovoltaic cell presented in FIG. 7A.

Certain properties of four junction (Si,Sn)Ge/GaInNAsSb/(Al,In)GaAs/(Al)InGaP photovoltaic cells are shown in FIG. 7A and FIG. 7B. FIG. 7A shows a J/V curve for a four junction (Si,Sn)Ge/GaInNAsSb/(Al,In)GaAs/(Al)InGaP photovoltaic cell characterized by a short circuit current density Jsc of 15.4 mA/cm², an open circuit voltage Voc of 3.13 V, a fill factor of 84.4%, and an efficiency of 29.8%. The measurements were made using a 1 sun AM0 spectrum at a junction temperature of 25° C. FIG. 7B shows the internal quantum efficiency for each of the four subcells as a function of irradiance wavelength. efficiency is greater than about 90% over most of the irradiance wavelength range from about 400 nm to about 1600 nm.

Various properties of the four junction (Si,Sn)Ge/GaInNAsSb/(Al,In)GaAs/(Al)InGaP photovoltaic cells shown in FIG. 7A and FIG. 7B are provided in Table 6.

TABLE 6

Properties of four junction GaINAsSb-containing photovoltaic cells.

| | (Al)InGaP/(Al,In)GaAs/GaInNAsSb/(Si,Sn)Ge | |
|---|---|---|
| | Four Junction Cell (1) | Four Junction Cell (2) |
| Voc (V) | 3.13 | 3.15 |
| Jsc (mA/cm²) | 15.4 | 15.2 |
| FF (%) | 84 | 85.5 |
| EQE (%) | 29.8 | 29.9 |
| J1 - (Al)InGaP Jsc (mA/cm²)/Eg (eV) | — | 15.15/1.97 |
| J2- (Al,In)GaAs Jsc (mA/cm²)/Eg (eV) | — | 15.67/1.47 |
| J3 - GaInNAsSb Jsc (mA/cm²)/Eg (eV) | — | 16/1.06 |
| J4 - (Si,Sn)Ge Jsc (mA/cm²)/Eg (eV) | — | 15.8/0.67 |

In certain embodiments, a multijunction photovoltaic cell can comprise:
a first subcell comprising (Al)InGaP;
a second subcell comprising (Al,In)GaAs underlying the first subcell;
a third subcell comprising $Ga_{1-x}In_xN_yAs_{1-y-z}Sb_z$ underlying the second subcell; and
a fourth subcell comprising (Si,Sn)Ge underlying the third subcell; wherein,
each of the subcells is lattice matched to each of the other subcells;
the third subcell is characterized by a bandgap from 0.83 eV to 1.22 eV; and
the third subcell is characterized by an internal quantum efficiency greater than 70% at an irradiance energy throughout the range from 0.95 eV to 1.55 eV at a junction temperature of 25° C.

In certain embodiments, a multijunction photovoltaic cell can comprise $Ga_{1-x}In_xN_yAs_{1-y-z}Sb_z$ subcell characterized by an internal quantum efficiency greater than 80% at an irradiance energy throughout the range from 1.1 eV to 1.5 eV.

In certain embodiments, a four-junction multijunction photovoltaic cell comprising a $Ga_{1-x}In_xN_yAs_{1-y-z}Sb_z$ subcell can be characterized by,
an open circuit voltage Voc equal to or greater than 2.5 V;
a short circuit current density Jsc equal to or greater than 8 mA/cm²;

a fill factor equal to or greater than 75%; and
an efficiency greater than 25%,
measured using a 1 sun AM1.5D or AM0 spectrum at a junction temperature of 25° C.

In certain embodiments, a four-junction multijunction photovoltaic cell comprising a $Ga_{1-x}In_xN_yAs_{1-y-z}Sb_z$ subcell can be characterized by,
an open circuit voltage Voc equal to or greater than 3.0 V;
a short circuit current density Jsc equal to or greater than 15 mA/cm²;
a fill factor equal to or greater than 80%; and
an efficiency greater than 25%,
measured using a 1 sun AM1.5D or AM0 spectrum at a junction temperature of 25° C.

In certain embodiments, a four-junction multijunction photovoltaic cell comprising a $Ga_{1-x}In_xN_yAs_{1-y-z}Sb_z$ subcell can be characterized by,
an open circuit voltage Voc from 2.5 V to 3.5 V;
a short circuit current density Jsc from 13 mA/cm² to 17 mA/cm²;
a fill factor from 80% to 90%; and
an efficiency from 28% to 36%,
measured using a 1 sun AM0 spectrum at a junction temperature of 25° C.

In certain embodiments, a four-junction multijunction photovoltaic cell comprising a $Ga_{1-x}In_xN_yAs_{1-y-z}Sb_z$ subcell can be characterized by,
an open circuit voltage Voc from 3.0 V to 3.5 V;
a short circuit current density Jsc from 8 mA/cm² to 14 mA/cm²;
a fill factor from 80% to 90%; and
an efficiency from 28% to 36%,
measured using a 1 sun AM1.5D spectrum at a junction temperature of 25° C.

In certain embodiments, a four-junction multijunction photovoltaic cell comprising a $Ga_{1-x}In_xN_yAs_{1-y-z}Sb_z$ subcell can comprise:
a first subcell having a bandgap from 1.9 eV to 2.2 eV;
a second subcell having a bandgap from 1.40 eV to 1.57 eV;
a third subcell having a bandgap from 0.98 eV to 1.2 eV; and
a fourth subcell having a bandgap from 0.67 eV.

In certain embodiments of a four-junction multijunction photovoltaic cell comprising a $Ga_{1-x}In_xN_yAs_{1-y-z}Sb_z$ subcell values for x, y, and z are $0.075 \leq x \leq 0.083$, $0.015 \leq y \leq 0.020$, and $0.003 \leq z \leq 0.09$.

In certain embodiments of a four-junction multijunction photovoltaic cell comprising a $Ga_{1-x}In_xN_yAs_{1-y-z}Sb_z$ subcell, the $Ga_{1-x}In_xN_yAs_{1-y-z}Sb_z$ subcell can be characterized by,
an open circuit voltage Voc from 0.42 V to 0.57 V;
a short circuit current density Jsc from 10 mA/cm² to 13 mA/cm²; and
a bandgap from 1.0 eV to 1.17 eV,
measured using a 1 sun AM1.5D spectrum at a junction temperature of 25° C.

Figure 8:
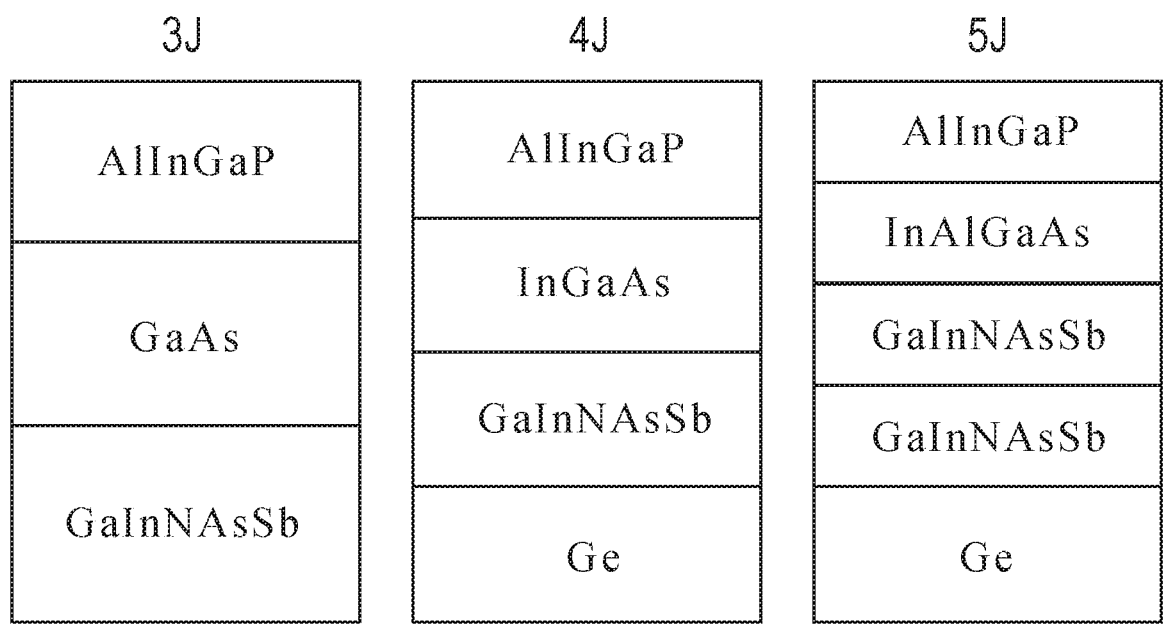
FIG. 8 shows examples of subcell compositions for three-junction, four-junction, and five-junction photovoltaic cells.

To increase the photovoltaic cell efficiency, five junction photovoltaic cells can be fabricated. Examples of the composition of photovoltaic cell stacks for three junction, four junction, and five junction photovoltaic cells are shown in FIG. 8. As shown in FIG. 8, for five junction and six junction cells, two $Ga_{1-x}In_xN_yAs_{1-y-z}Sb_z$ subcells may be used.

To demonstrate the feasibility of using adjacent $Ga_{1-x}In_xN_yAs_{1-y-z}Sb_z$ subcells, four junction photovoltaic cells having a bottom $Ga_{1-x}In_xN_yAs_{1-y-z}Sb_z$ subcell and an overlying $Ga_{1-x}In_xN_yAs_{1-y-z}Sb_z$ subcell were fabricated and evaluated. The four junction photovoltaic cells were fabricated on a GaAs substrate. Each of the subcells is substantially lattice matched to each of the other subcells and to the GaAs substrate. The multijunction photovoltaic cells do not comprise a metamorphic buffer layer between adjacent subcells. The composition of each of the two $Ga_{1-x}In_xN_yAs_{1-y-z}Sb_z$ subcells, the (Al,In)GaAs subcell, and the (Al)InGaP subcell is selected to lattice match to the GaAs substrate and to provide an appropriate band gap.

The four junction photovoltaic cells had a bottom $Ga_{1-x}In_xN_yAs_{1-y-z}Sb_z$ subcell (J4), an overlying $Ga_{1-x}In_xN_yAs_{1-y-z}Sb_z$ subcell (J3), an overlying (Al,In)GaAs subcell (J2), and a top (Al)InGaP subcell (J1). The band gaps and Jsc under a 1 sun AM1.5D or AM0 spectrum are shown in Table 7.

TABLE 7

Band gap and Jsc for four junction photovoltaic cells having two $Ga_{1-x}In_xN_yAs_{1-y-z}Sb_z$ subcells.

| Subcell | Composition | Band Gap (eV) | Jsc (mA/cm²) |
|---------|-------------|---------------|--------------|
| J1 | (Al)InGaP | 2.05-2.08 | 12.7-13.2 |
| J2 | (Al,In)GaAs | 1.60-1.64 | 11.8-14.2 |
| J3 | $Ga_{1-x}In_xN_yAs_{1-y-z}Sb_z$ | 1.20-1.21 | 15.2-16.8 |
| J4 | $Ga_{1-x}In_xN_yAs_{1-y-z}Sb_z$ | 0.88-0.89 | 12.9-13.2 |

The internal and external quantum efficiencies for each of the subcells of the photovoltaic cell presented in Table 6 is shown in FIGS. 9A and 9B.

The four junction photovoltaic cells having two $Ga_{1-x}In_xN_yAs_{1-y-z}Sb_z$ subcells exhibit internal and external quantum efficiencies over 70% throughout an irradiance wavelength range from about 400 nm (3.1 eV) to about 1300 nm (0.95 eV), and over 80% throughout an irradiance wavelength range from about 450 nm (2.75 eV) to about 1200 nm (1.03 eV).

Other four junction photovoltaic cells having two $Ga_{1-x}In_xN_yAs_{1-y-z}Sb_z$ similar to those presented in Table 7 exhibit an open circuit voltage from about 3.67 eV to about 3.69 eV, a short circuit current density from about 9.70 mA/cm² to about 9.95 mA/cm², a fill factor from about 80% to about 85% and an external quantum efficiency from about 29.0% to about 31% measured using a 1 sun AM) or AM1.5D spectrum at a junction temperature of 25° C.

In these photovoltaic cells, the bottom $Ga_{1-x}In_xN_yAs_{1-y-z}Sb_z$ subcell (J4) has a band gap from 0.95 eV to about 0.99 eV such as from 0.96 eV to 0.97 eV, and values for x, y, and z of $0.11 \leq x \leq 0.15$, $0.030 \leq y \leq 0.034$ and $0.007 \leq z \leq 0.14$, and in certain embodiments, values for x, y, and z of $0.12 \leq x \leq 0.14$, $0.031 \leq y \leq 0.033$ and $0.007 \leq z \leq 0.14$.

In these photovoltaic cells, the second $Ga_{1-x}In_xN_yAs_{1-y-z}Sb_z$ subcell (J3) has a band gap from 1.1 eV to about 1.3 eV, and values for x, y, and z of $0.026 \leq x \leq 0.030$, $0.014 \leq y \leq 0.018$ and $0.005 \leq z \leq 0.009$, and in certain embodiments, values for x, y, and z of $0.027 \leq x \leq 0.029$, $0.015 \leq y \leq 0.017$ and $0.006 \leq z \leq 0.008$.

These results demonstrate the feasibility of incorporating two $Ga_{1-x}In_xN_yAs_{1-y-z}Sb_z$ subcells into a photovoltaic cell to improve multijunction photovoltaic cell performance. As shown in FIG. 8, to improve the collection efficiency at lower wavelengths, five junction and six junction photovoltaic cells having two $Ga_{1-x}In_xN_yAs_{1-y-z}Sb_z$ subcells can also include a bottom active Ge subcell. Lattice matched five junction photovoltaic cells as shown in FIG. 8 are expected to exhibit external quantum efficiencies over 34% and over 36%, respectively, under 1 sun AM0 illumination at a junction temperature of 25° C.

A four-junction photovoltaic cell comprising two $Ga_{1-x}In_xN_yAs_{1-y-z}Sb_z$ subcells can be adapted for use in five junction multijunction photovoltaic cells. The stack of (Al)InGaP/(Al,In)GaAs/$Ga_{1-x}In_xN_yAs_{1-y-z}Sb_z$/$Ga_{1-x}In_xN_yAs_{1-y-z}Sb_z$ layers can overly a Ge layer that can function as the fifth subcell. In photovoltaic cells having a Ge subcell, each of the base layers can be lattice matched to the Ge subcell.

In certain embodiments, a four- and five junction multijunction photovoltaic cell comprising two $Ga_{1-x}In_xN_yAs_{1-y-z}Sb_z$ subcells can comprise:
- a first subcell comprising (Al)InGaP;
- a second subcell comprising (Al,In)GaAs underlying the first subcell;
- a third subcell comprising $Ga_{1-x}In_xN_yAs_{1-y-z}Sb_z$ underlying the second subcell; and
- a fourth subcell comprising $Ga_{1-x}In_xN_yAs_{1-y-z}Sb_z$ underlying the third subcell; wherein,
  - each of the subcells is lattice matched to each of the other subcells;
  - each of the fourth subcell and the third subcell is characterized by a bandgap with a range from 0.83 eV to 1.3 eV; and
  - each of the fourth subcell and the third subcell is characterized by an internal quantum efficiency greater than 70% at an irradiance energy throughout the range from 0.95 eV to 1.55 eV.

In certain embodiments, a four- and five junction multijunction photovoltaic cell comprising two $Ga_{1-x}In_xN_yAs_{1-y-z}Sb_z$ subcells, each of the two $Ga_{1-x}In_xN_yAs_{1-y-z}Sb_z$ subcells can be characterized by an internal quantum efficiency greater than 80% at an illumination energy throughout the range from 1.1 eV to 1.5 eV.

In certain embodiments, a four- and five junction multijunction photovoltaic cell comprising two $Ga_{1-x}In_xN_yAs_{1-y-z}Sb_z$ subcells, the multijunction photovoltaic cell can be characterized by,
- an open circuit voltage Voc equal to or greater than 2.8 V;
- a short circuit current density Jsc equal to or greater than 18 mA/cm$^2$;
- a fill factor equal to or greater than 80%; and
- an efficiency equal to or greater than 29%,
measured using a 1 sun 1.5 AM0 spectrum at a junction temperature of 25° C.

In certain embodiments, a four- and five junction multijunction photovoltaic cell comprising two $Ga_{1-x}In_xN_yAs_{1-y-z}Sb_z$ subcells, the multijunction photovoltaic cell can comprise:
- a first subcell characterized by a bandgap from 1.90 eV to 2.20 eV;
- a second subcell characterized by a bandgap from 1.4 eV to 1.7 eV;
- a third subcell characterized by a bandgap from 0.97 eV to 1.3 eV; and
- a fourth subcell characterized by a bandgap from 0.8 eV to 1 eV.

In certain embodiments, a four- and five junction multijunction photovoltaic cell comprising two $Ga_{1-x}In_xN_yAs_{1-y-z}Sb_z$ subcells, the multijunction photovoltaic cell can comprise:
- a fourth subcell comprising $Ga_{1-x}In_xN_yAs_{1-y-z}Sb_z$ is characterized by a bandgap from 0.9 eV to 1 eV;
- a third subcell comprising $Ga_{1-x}In_xN_yAs_{1-y-z}Sb_z$ is characterized by a bandgap from 1.1 eV to 1.3 eV;
- a second subcell comprising (Al,In)GaAs is characterized by a bandgap from 1.5 eV to 1.7 eV; and
- a first subcell comprising (Al)InGaP is characterized by a bandgap from 1.9 eV to 2.1 eV;

wherein the multijunction photovoltaic cell can be characterized by,
- an open circuit voltage Voc equal to or greater than 3.5 V;
- a short circuit current density Jsc equal to or greater than 8 mA/cm$^2$;
- a fill factor equal to or greater than 75%; and
- an efficiency equal to or greater than 27%,
measured using a 1 sun AM1.5D spectrum at a junction temperature of 25° C.

In certain embodiments, a four- and five junction multijunction photovoltaic cell comprising two $Ga_{1-x}In_xN_yAs_{1-y-z}Sb_z$ subcells, the multijunction photovoltaic cell can be characterized by,
- an open circuit voltage Voc from 3.65 V to 3.71 V;
- a short circuit current density Jsc from 9.7 mA/cm$^2$ to 10.0 mA/cm$^2$;
- a fill factor from 80% to 85%; and
- an efficiency from 29% to 31%,
measured using a 1 sun AM1.5D spectrum at a junction temperature of 25° C.

In certain embodiments, a four- and five junction multijunction photovoltaic cell comprising two $Ga_{1-x}In_xN_yAs_{1-y-z}Sb_z$ subcells, the multijunction photovoltaic cell can be characterized by,
- an open circuit voltage Voc equal to or greater than 2.5 V;
- a short circuit current density Jsc equal to or greater than 8 mA/cm$^2$;
- a fill factor equal to or greater than 75%; and
- an efficiency equal to or greater than 25%,
measured using a 1 sun AM1.5D or AM0 spectrum at a junction temperature of 25° C.

In certain embodiments, a four- and five junction multijunction photovoltaic cell comprising two $Ga_{1-x}In_xN_yAs_{1-y-z}Sb_z$ subcells, the multijunction photovoltaic cell can be characterized by,
- an open circuit voltage Voc from 2.5 V to 3.5 V;
- a short circuit current density Jsc from 13 mA/cm$^2$ to 17 mA/cm$^2$; and
- a fill factor from 80% to 90%; and
- an efficiency from 28% to 36%,
measured using a 1 sun AM0 spectrum at a junction temperature of 25° C.

In certain embodiments, a four- and five junction multijunction photovoltaic cell comprising two $Ga_{1-x}In_xN_yAs_{1-y-z}Sb_z$ subcells, the multijunction photovoltaic cell can be characterized by,
- an open circuit voltage Voc from 3 V to 3.5 V;
- a short circuit current density Jsc from 8 mA/cm$^2$ to 14 mA/cm$^2$;
- a fill factor from 80% to 90%; and
- an efficiency from 28% to 36%,
measured using a 1 sun AM1.5D spectrum at a junction temperature of 25° C.

Five junction multijunction photovoltaic cells are also provided. A five junction multijunction photovoltaic cell an comprise two $Ga_{1-x}In_xN_yAs_{1-y-z}Sb_z$ subcells. The two $Ga_{1-x}In_xN_yAs_{1-y-z}Sb_z$ subcells can overly a (Si,Sn)Ge subcell and can be lattice matched to the (Si,Sn)Ge subcell. Each of the subcells can be lattice matched to each of the other subcells and can be lattice matched to the (Si,Sn)Ge subcell. A (Si,Sn)Ge subcell can have a band gap from 0.67 eV to 1.0 eV.

In certain embodiments, a five junction multijunction photovoltaic cell comprising two $Ga_{1-x}In_xN_yAs_{1-y-z}Sb_z$ subcells can comprise:

a first subcell comprising (Al)InGaP;

a second subcell comprising (Al,In)GaAs underlying the first subcell;

a third subcell comprising $Ga_{1-x}In_xN_yAs_{1-y-z}Sb_z$ underlying the second subcell;

a fourth subcell comprising $Ga_{1-x}In_xN_yAs_{1-y-z}Sb_z$ underlying the third subcell;

a fifth subcell comprising (Si,Sn)Ge underling the fourth subcell; wherein, each of the subcells is lattice matched to each of the other subcells;

each of the fourth subcell and the third subcell is characterized by a bandgap with a range from 0.83 eV to 1.3 eV; and each of the fourth subcell and the third subcell is characterized by an internal quantum efficiency greater than 70% at an irradiance energy throughout the range from 0.95 eV to 1.55 eV.

In certain embodiments of a five junction multijunction photovoltaic cell each of the two $Ga_{1-x}In_xN_yAs_{1-y-z}Sb_z$ subcells can be characterized by an internal quantum efficiency greater than 80% at an illumination energy throughout the range from 1.1 eV to 1.5 eV.

In multijunction photovoltaic cells provided by the present disclosure, one or more subcells can comprise AlInGaAsP where the content each Group III and each Group V element can range from 0 to 1, and the AlInGaAsP base can be lattice matched to a substrate and to each of the other subcells in the multijunction photovoltaic cell. The band gap of a AlInGaAsP subcell can be from 1.8 eV to 2.3 eV. An AlInGaAsP subcell can comprise an (Al)InGaP subcell or an (Al,In)GaAs subcell. Multijunction photovoltaic cells provided by the present disclosure can comprise at least one $Ga_{1-x}In_xN_yAs_{1-y-z}Sb_z$ and one or more of the other subcells can comprise a AlInGaAsP subcell.

In certain embodiments of multijunction photovoltaic cells, a subcell such as a $Ga_{1-x}In_xN_yAs_{1-y-z}Sb_z$ and/or a AlInGaAsP subcell can be a homojunction in which the emitter and the base of a subcell comprise the same material composition and have the same bandgap.

In certain embodiments of multijunction photovoltaic cells, a subcell such as a $Ga_{1-x}In_xN_yAs_{1-y-z}Sb_z$ and/or a AlInGaAsP subcell can be a heterojunction in which the emitter and the base of a subcell comprise the same material but have a different composition such that the band gap of the emitter and the band gap of the base of a subcell are different. In certain embodiments, the band gap of the emitter is higher than the band gap of the base, and in certain embodiments, the band gap of the emitter is lower than the band gap of the base. Reverse heterojunction $Ga_{1-x}In_xN_yAs_{1-y-z}Sb_z$ subcells are disclosed in U.S. Pat. No. 9,153,724, which is incorporated by reference in its entirety.

It should be noted that there are alternative ways of implementing the embodiments disclosed herein. Accordingly, the present embodiments are to be considered as illustrative and no restrictive. Furthermore, the claims are not to be limited to the details given herein, and are entitled their full scope and equivalents thereof.

What is claimed is:

1. A method of fabricating a multijunction photovoltaic cell comprising depositing from three to five subcells overlying a (Si,Sn)Ge substrate, wherein, each of the three to five subcells is lattice matched to each of the other subcells and to the (Si,Sn)Ge substrate;

at least one of the subcells comprises a GaInNAsSb subcell comprising a $Ga_{1-x}In_xN_yAs_{1-y-z}Sb_z$ base layer, wherein the $Ga_{1-x}In_xN_yAs_{1-y-z}Sb_z$ base layer is characterized by:

values of $0.16 \leq x \leq 0.19$, $0.040 \leq y \leq 0.051$, and $0.010 \leq z \leq 0.018$;

a band gap from 0.89 eV to 0.92 eV;

a thickness from 1 µm to 4 µm;

a short circuit current density Jsc greater than 15 mA/cm$^2$; and an open circuit voltage Voc greater than 0.3 V, wherein the Jsc and the Voc are measured using a 1 sun AM1.5D spectrum at a junction temperature of 25° C.

2. The method of claim 1, wherein the $Ga_{1-x}In_xN_yAs_{1-y-z}Sb_z$ base layer has an internal quantum efficiency greater than 70% at irradiance energies from about 1.03 eV to about 1.38 eV.

3. The method of claim 1, wherein the GaInNAsSb subcell is characterized by a Eg/q-Voc equal to or greater than 0.55 V measured using a 1 sun AM1.5D spectrum at a junction temperature of 25° C.

4. The method of claim 1, wherein the GaInNAsSb subcell is characterized by a Eg/q-Voc from 0.4 V to 0.7 V measured using a 1 sun AM1.5D spectrum at a junction temperature of 25° C.

5. The method of claim 1, wherein the GaInNAsSb subcell is characterized by a compressive strain less than 0.6%.

6. The method of claim 1, wherein the GaInNAsSb subcell is characterized by a compressive strain from 0.1% to 0.6%.

7. The method of claim 1, wherein the GaInNAsSb subcell has a thickness from 2 µm to 3 µm.

8. The method of claim 1, wherein at least two of the subcells comprises a GaInNAsSb subcell.

9. The method of claim 1, wherein depositing a GaInNAsSb subcell comprises depositing using molecular beam epitaxy.

10. The method of claim 1, wherein depositing a subcell other than a GaInNAsSb subcell comprises depositing using metal organic chemical vapor deposition.

11. The method of claim 1, further comprising after depositing the from three to five subcells, annealing the from three to five subcells at a temperature from 400° C. to 1000° C. for between 10 seconds to 10 hours.

\* \* \* \* \*